(12) United States Patent
Chiu

(10) Patent No.: US 12,068,373 B2
(45) Date of Patent: Aug. 20, 2024

(54) SEMICONDUCTOR DEVICE AND FABRICATION METHOD THEREOF

(71) Applicant: INNOSCIENCE (ZHUHAI) TECHNOLOGY CO., LTD., Zhuhai (CN)

(72) Inventor: Han-Chin Chiu, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 946 days.

(21) Appl. No.: 17/042,915

(22) PCT Filed: Aug. 7, 2020

(86) PCT No.: PCT/CN2020/107647
§ 371 (c)(1),
(2) Date: Sep. 29, 2020

(87) PCT Pub. No.: WO2022/027536
PCT Pub. Date: Feb. 10, 2022

(65) Prior Publication Data
US 2022/0376050 A1 Nov. 24, 2022

(51) Int. Cl.
*H01L 29/10* (2006.01)
*H01L 29/04* (2006.01)
(Continued)

(52) U.S. Cl.
CPC ........ *H01L 29/1029* (2013.01); *H01L 29/045* (2013.01); *H01L 29/2003* (2013.01); *H01L 29/66462* (2013.01); *H01L 29/7786* (2013.01)

(58) Field of Classification Search
None
See application file for complete search history.

(56) References Cited

U.S. PATENT DOCUMENTS

| 10,388,753 B1 | 8/2019 | Armstrong et al. |
| 2006/0255341 A1* | 11/2006 | Pinnington ............ B82Y 20/00 257/E33.068 |

(Continued)

FOREIGN PATENT DOCUMENTS

| CN | 104201202 A | 12/2014 |
| CN | 106340536 A | 1/2017 |

(Continued)

OTHER PUBLICATIONS

Munshi et al. "Selective area growth of AlGaN nanopyramid arrays on graphene by metal organic vapor phase epitaxy" 2018, Applied Physics Letters 113, 263102. (Year: 2018).*

(Continued)

*Primary Examiner* — Bo B Jang
(74) *Attorney, Agent, or Firm* — JCIPRNET

(57) ABSTRACT

The present disclosure relates to a semiconductor device and a fabrication method thereof. The semiconductor device includes a substrate, a first nitride semiconductor layer on the substrate and a second nitride semiconductor layer on the first nitride semiconductor layer. The second nitride semiconductor layer has a first area and a second area, and the second nitride semiconductor layer has single crystals. The semiconductor device includes an electrode in contact with the first area. A first concentration of Aluminum (Al) of the first area is less than a second concentration of Al of the second area, and the single crystals in the first area take over a crystal structure of the first nitride semiconductor layer.

23 Claims, 28 Drawing Sheets

(51) Int. Cl.
  *H01L 29/20*   (2006.01)
  *H01L 29/66*   (2006.01)
  *H01L 29/778*  (2006.01)

(56) References Cited

U.S. PATENT DOCUMENTS

2011/0223746 A1   9/2011   Briere
2012/0018734 A1*  1/2012   Chae ..................... H01L 33/12
                                                  257/E33.013

FOREIGN PATENT DOCUMENTS

CN    108807510 A    11/2018
JP    2014041965 A    3/2014

OTHER PUBLICATIONS

Machine-generated English translation of JP 2014-041965 (Year: 2014).*
Machine-generated English translation of CN 108807510 (Year: 2018).*
D.Zhuang et al., "Wet etching of GaN, AlN, and SiC: a review", Materials Science and Engineering: R: Reports, 2005, vol. 48, pp. 1-46.
Seung Jae Hong et al., "Low-resistance Ohmic contacts for high-power GaN field-effect transistor obtained by selective area growth using plasma-assisted molecular beam epitaxy", Applied Physics Letters, 2006, vol. 89.
International Search Report and Written Opinion of the corresponding PCT application No. PCT/CN2020/107647 mailed on Mar. 26, 2021.

\* cited by examiner

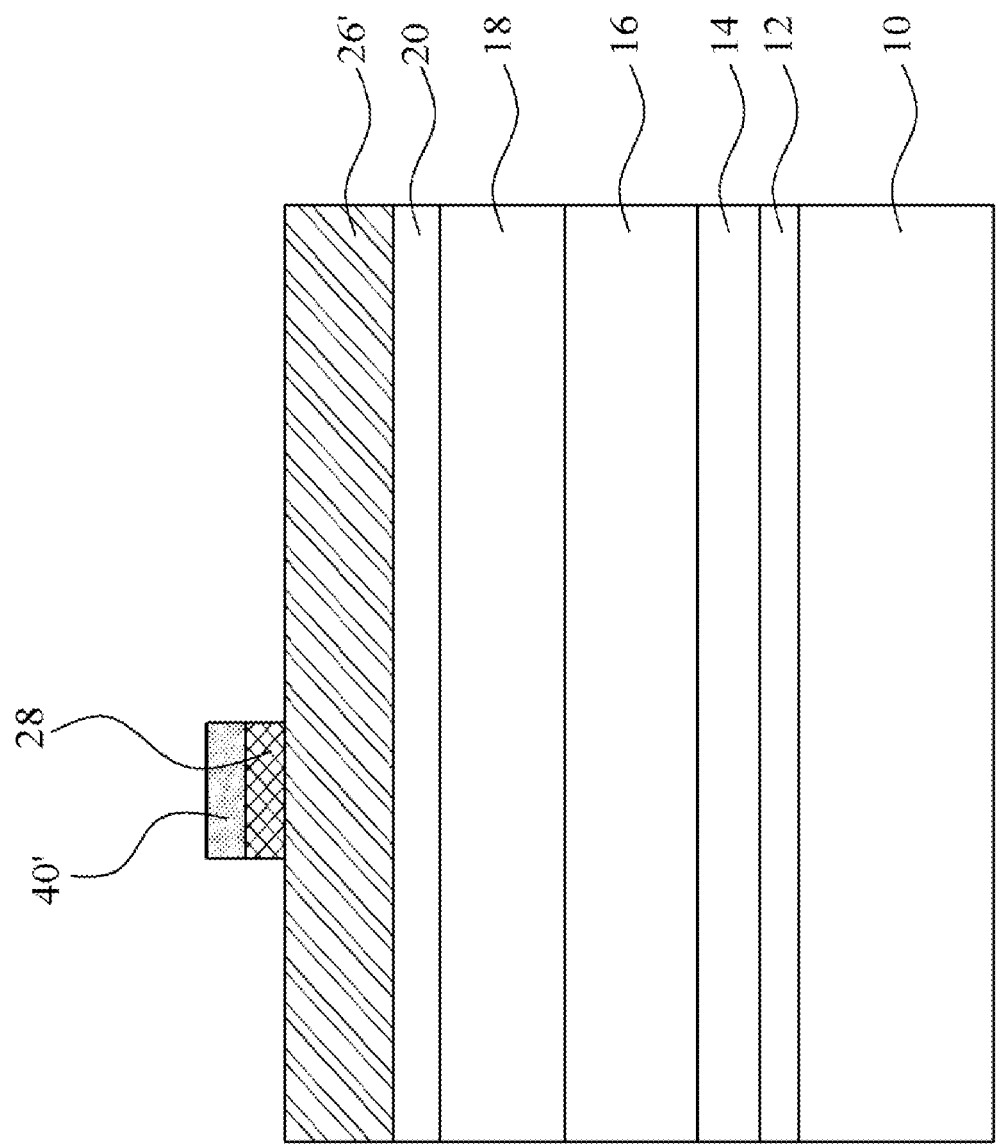

SEMICONDUCTOR DEVICE AND FABRICATION METHOD THEREOF

BACKGROUND

1. Technical Field

The present disclosure relates to semiconductor devices, more particularly to high electron mobility transistors (HEMTs) and fabrication methods thereof.

2. Description of the Related Art

A high electron mobility transistor (HEMT) includes two layers (e.g. channel layer and barrier layer) having different bandgaps to form a heterojunction. Polarization of the heterojunction forms a two-dimensional electron gas (2DEG) region in the channel layer adjacent to the interface between the channel layer and the barrier, which makes HEMTs operate or work in relatively high frequency bandwidth and relatively great voltage level.

However, it is found the turn-on resistance is relatively great when HEMT is going to work, which could adversely affect performance thereof.

SUMMARY

According to some embodiments of the present disclosure, a semiconductor device including a substrate, a first nitride semiconductor layer on the substrate and a second nitride semiconductor layer on the first nitride semiconductor layer is provided. The second nitride semiconductor layer has a first area and a second area, and the second nitride semiconductor layer has single crystals. The semiconductor device includes an electrode in contact with the first area, wherein a first concentration of Aluminum (Al) of the first area is less than a second concentration of Aluminum (Al) of the second area, and the single crystals in the first area take over a crystal structure of the first nitride semiconductor layer.

According to some embodiments of the present disclosure, a semiconductor device is provided, including a substrate, a first nitride semiconductor layer above the substrate and a second nitride semiconductor layer on the first nitride semiconductor layer. The second nitride semiconductor layer has a first area and a second area, and the second nitride semiconductor layer has single crystals. The semiconductor device includes an electrode in contact with the first area, wherein a first concentration of Aluminum (Al) of the first area is different from a second concentration of Aluminum (Al) of the second area, and the first area is devoid of polycrystalline structures.

According to some embodiments of the present disclosure, a method for fabricating a semiconductor device is provided. The method comprises providing a semiconductor structure having a substrate, a channel layer and a barrier layer. The method comprises providing a passivation layer on the barrier layer, the passivation layer exposing a first area of the barrier layer and covering a second area of the barrier layer. The method further comprises wet-soaking the first area of the barrier layer with a first solution so that a first concentration of Aluminum (Al) of the first area is different from a second concentration of Aluminum (Al) of the second area.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIGS. 5A, 5B, 5C, 5D, 5E, 5F, 5G, 5H, 5I and 5J illustrate operations for fabricating a semiconductor device according to some other embodiments of the present disclosure;

DETAILED DESCRIPTION

Figure 1A:
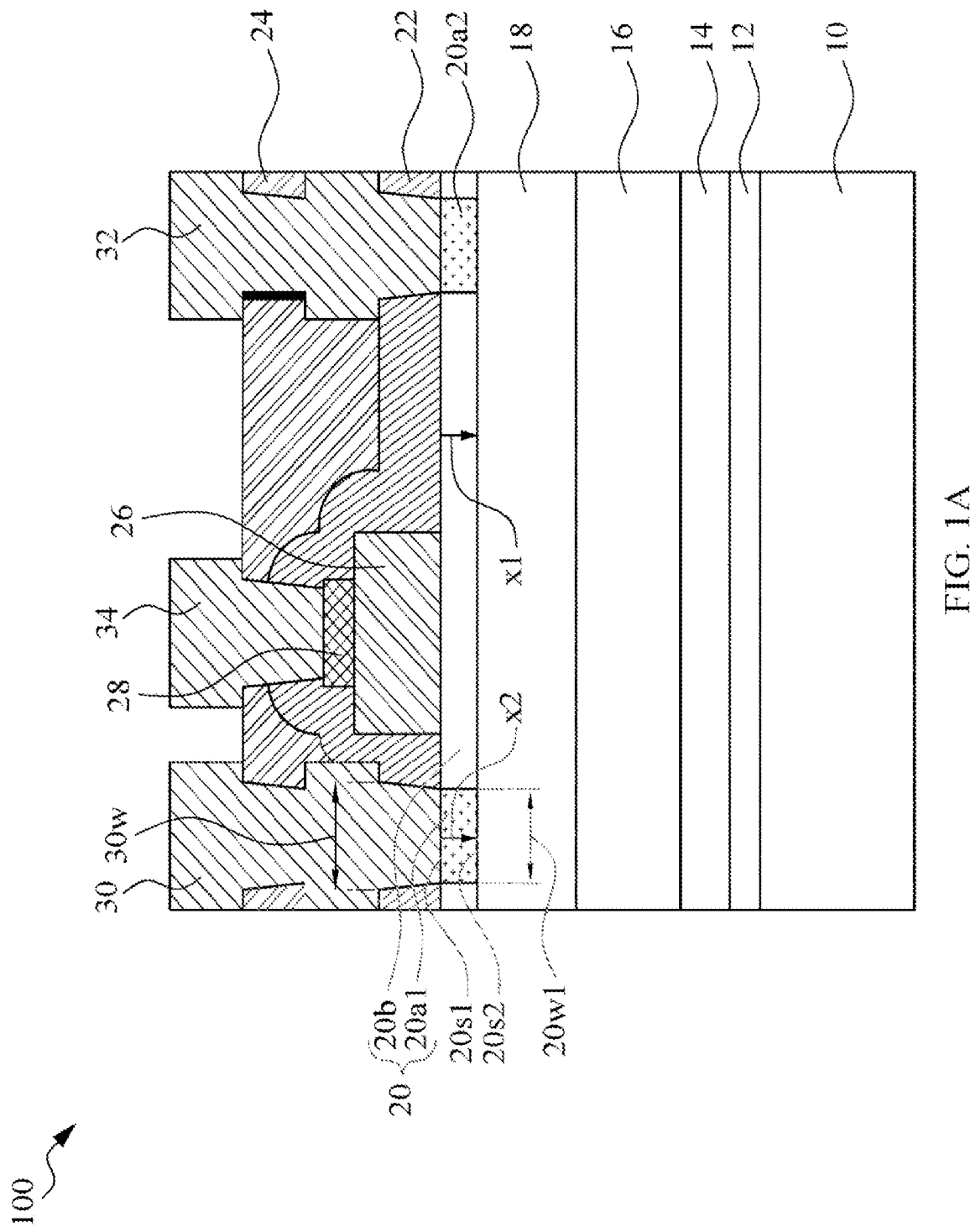
FIG. 1A illustrates a cross-sectional view of a semiconductor device according to some embodiments of the present disclosure.

Embodiments of the present disclosure are discussed in detail below. It should be appreciated, however, that the present disclosure provides many applicable concepts that can be embodied in a wide variety of specific contexts. It should be appreciated that the following disclosure provides for many different embodiments, or examples, for implementing different features of the provided subject matter. Specific examples of components and arrangements are described below. These are, of course, merely examples and are not intended to be limiting.

The following embodiments or examples as illustrated in the drawings are described using a specific language. It should be appreciated, however, that the specific embodiments discussed are merely illustrative and do not limit the scope of the disclosure. In addition, it should be appreciated by persons having ordinary skill in the art that any changes and/or modifications of the disclosed embodiments as well as any further applications of the principles disclosed herein are encompassed within the scope of the present disclosure.

In addition, the present disclosure may repeat reference numerals and/or letters in the various examples. This repetition is for the purpose of simplicity and clarity and does not in itself dictate a relationship between the various embodiments and/or configurations discussed.

Gallium nitride (GaN) is anticipated to be the key material for a next generation power semiconductor device, having the properties of a higher breakdown strength, faster switching speed, higher thermal conductivity and lower on-resistance ($R_{on}$). Power devices which include this wide-bandgap semiconductor material can significantly outperform the traditional Si-based power chips (for example, MOSFETs). As such, GaN-based power devices will play a key role in the market of power conversion products, which includes battery chargers, smartphones, computers, servers, automotive electronics, lighting systems and photovoltaics.

To realize high performance GaN HEMTs, a lower resistance as the HEMTs turn on (which is called $R_{on}$) is preferable. The intrinsic $R_{on}$ of a GaN HEMT includes resistances of channel ($R_{ch}$, 2DEG under gate), access region ($R_{ac}$, 2DEG between gate to source and gate to drain), and source/drain contacts ($R_c$, between ohmic metals to source/drain). To reduce the resistance between source/drain ($R_{ch}+R_{ac}$), increasing Al % of the barrier layer AlGaN onto the GaN 2DEG channel is one effective method; however, it will also increase $R_c$, while higher Al % AlGaN has a higher bandgap which retards the transportation of carriers. Therefore, there is a need to achieve low $R_{on}$ without sacrificing $R_c$.

FIG. 1A illustrates a cross-sectional view of a semiconductor device according to some embodiments of the present disclosure. The HEMT 100 may include a substrate 10, a seed layer 12, a buffer layer 14, an electron blocking layer (EBL) 16, a channel layer 18, a barrier layer 20, passivation layers 22 and 24, a semiconductor gate 26, and a gate conductor 28 disposed on the semiconductor gate 26. The semiconductor gate 26 and the gate conductor 28 may form the gate of the HEMT 100. The HEMT 100 further comprises electrodes 30 and 32 in contact with the barrier layer 20. The HEMT 100 further comprises an electrode 34 in contact with the gate conductor 28. The electrodes 30 and 32 may form the source/drain electrodes of the HEMT 100.

The substrate 10 may include, for example, but is not limited to, silicon (Si), doped Si, silicon carbide (SiC), germanium silicide (SiGe), gallium arsenide (GaAs), or other semiconductor materials. The substrate 10 may include, for example, but is not limited to, sapphire, silicon on insulator (SOI), or other suitable materials. In some embodiments, the substrate 10 may include a silicon material. In some embodiments, the substrate 10 may be a silicon substrate.

The seed layer 12 is disposed on the substrate 10. The seed layer 12 helps to compensate for a mismatch in lattice structures between substrate 10 and the electron blocking layer 16. In some embodiments, seed layer 12 includes multiple layers. In some embodiments, seed layer 12 includes a same material formed at different temperatures. In some embodiments, seed layer 12 includes a step-wise change in lattice structure. In some embodiments, seed layer 12 includes a continuous change in lattice structure. In some embodiments, seed layer 12 is formed by epitaxially growing the seed layer on substrate 10.

The seed layer 12 can be doped with carbon. In some embodiments, a concentration of carbon dopants ranges from about $2\times10^{17}$ atoms/cm$^3$ to about $1\times10^{20}$ atoms/cm$^3$. In some embodiments, the seed layer 12 can be doped using an ion implantation process. In some embodiments, the seed layer 12 can be doped using an in-situ doping process. In some embodiments, the seed layer 12 can be formed using molecular oriented chemical vapor deposition (MOCVD), molecular beam epitaxy (MBE), hydride vapor phase epitaxy (HVPE), atomic layer deposition (ALD), physical vapor deposition (PVD) or another suitable formation process. In some embodiments, the in-situ doping process includes introducing the carbon dopants during formation of the seed layer 12. In some embodiments, a source of the carbon dopants includes a hydrocarbon ($C_xH_y$) such as $CH_4$, $C_7H_7$, $C_{16}H_{10}$, or another suitable hydrocarbon. In some embodiments, the source of the carbon dopants includes $CBr_4$, $CCl_4$, or another suitable carbon source.

As illustrated in FIG. 1A, the HEMT 100 includes a buffer layer 14 formed on the seed layer 12. The buffer layer 14 may include GaN, AlGaN, or aluminum nitride (AlN) and provides an interface from the non-GaN substrate to a GaN based active structure. The buffer layer 14 reduces defect concentration in the active device layers.

The electron blocking layer 16 may be disposed on the buffer layer 14. In some embodiments, the electron blocking layer 16 may include a group III-V layer. The electron blocking layer 16 may include, for example, but is not limited to, group III nitride, for example, a compound $Al_yGa_{(1-y)}N$, in which y≤1. The electron blocking layer 16 may have a bandgap that is greater than that of the channel layer 18.

The channel layer 18 may be disposed on the electron blocking layer 16. In some embodiments, the channel layer 18 may include a group III-V layer. The channel layer 18 may include, for example, but is not limited to, group III nitride, for example, a compound $Al_yGa_{(1-y)}N$, in which y≤1. In some embodiments, the channel layer 18 may include GaN. The channel layer 18 can also be referred to as a nitride semiconductor layer since the channel layer 18 contains nitride.

The barrier layer 20 may be disposed on the channel layer 18. In some embodiments, the barrier layer 20 may include a group III-V layer. The barrier layer 20 may include, for example, but not is limited to, group III nitride, for example, a compound $Al_yGa_{(1-y)}N$, in which y≤1. The barrier layer 20 may have a bandgap that is greater than that of the channel layer 18. In some embodiments, a material of the barrier layer 20 may include AlGaN. In some embodiments, a material of the barrier layer 20 may include undoped AlGaN. The barrier layer 20 can also be referred to as a nitride semiconductor layer since the barrier layer 20 contains nitride.

A heterojunction may be formed between the barrier layer 20 and the channel 18. The polarization of the heterojunction of different nitrides forms a two-dimensional electron gas (2DEG) region in the channel layer 18. The 2DEG region is usually formed in the layer that has a lower bandgap (e.g., GaN).

Referring to FIG. 1A, the barrier layer 20 includes regions/areas 20a1, 20a2 and 20b. The region 20a1 can be disposed between the electrode 30 and the 18 channel layer 18. The region 20a2 can be disposed between the electrode 32 and the channel layer 18. The region 20a1 can be in contact with the electrode 30. The region 20a2 can be in contact with the electrode 32.

The region 20a1 includes a width 20w1 near the interface between the region 20a1 and the electrode 30. The electrode 30 includes a width 30w near the interface between the region 20a1 and the electrode 30.

In some embodiments, the width 20w1 can be substantially identical to the width 30w. In some embodiments, the width 20w1 can be greater than the width 30w. In some embodiments, the width 20w1 can be smaller than the width 30w. The region 20a2 may include a structure/size similar to that of the region 20a1. The electrode 32 may include a structure/size similar to that of the electrode 30.

In some embodiments, the concentration of an element in the region 20a1 is different from that in the region 20b. In some embodiments, the concentration of an element in the region 20a1 is less than that in the region 20b. In some embodiments, the concentration of a conductive element in the region 20a1 is different from that in the region 20b. In some embodiments, the concentration of a conductive element in the region 20a1 is less than that in the region 20b. In some embodiments, the concentration of an electrically conductive element in the region 20a1 is different from that in the region 20b. In some embodiments, the concentration of an electrically conductive element in the region 20a1 is less than that in the region 20b. In some embodiments, the concentration of a group III element in the region 20a1 is different from that in the region 20b. In some embodiments, the concentration of a group III element in the region 20a1 is less than that in the region 20b.

In some embodiments, the concentration of Aluminum (Al) in the region 20a1 is different from that in the region 20b. In some embodiments, the concentration of Al in the region 20a1 is lower than that in the region 20b. In some embodiments, the region 20a1 contains less Al than does the region 20b. In some embodiments, the amount of Al in the region 20a1 is less than that in the region 20b.

In some embodiments, the concentration of Al in the region 20a1 can be less than 30%. In some embodiments, the concentration of Al in the region 20a1 can be less than 20%. In some embodiments, the concentration of Al in the region 20a1 can be less than 10%.

In some embodiments, the concentration of Al in the region 20a1 can be 40% less than the concentration of Al in the region 20b. In some embodiments, the concentration of Al in the region 20a1 can be 50% less than the concentration of Al in the region 20b. In some embodiments, the concentration of Al in the region 20a1 can be 60% less than the concentration of Al in the region 20b. In some embodiments, the concentration of Al in the region 20a1 can be 70% less than the concentration of Al in the region 20b. In some embodiments, the concentration of Al in the region 20a1 can be 80% less than the concentration of Al in the region 20b.

The concentration of Al in the region 20b can be uneven across the top surface 20s1 to the bottom surface 20s2. In some embodiments, the concentration of Al in the region 20b can be in a gradient distribution from the top surface 20s1 to the bottom surface 20s2. In some embodiments, the concentration of Al of the region 20b near the upper surface 20s1 can be higher than the concentration of Al near the bottom surface 20s2. A line scan result obtained by transmission electron microscope (TEM) along the arrow x1 as shown in FIG. 1A will be illustrated in accordance with FIG. 1B.

The concentration of Al in the region 20a1 can be uneven across the top surface 20s1 to the bottom surface 20s2 of the region 20a1. In some embodiments, the concentration of Al in the region 20a1 can be in a gradient distribution from the top surface 20s1 to the bottom surface 20s2. In some embodiments, the concentration of Al near the bottom surface 20s2 can be higher than the concentration of Al near the upper surface 20s1. A line scan result obtained by transmission electron microscope (TEM) along the arrow x2 as shown in FIG. 1A will be illustrated in accordance with FIG. 1C.

The region 20a2 may include a concentration of Al similar to that of the region 20a1. The region 20a2 may include a distribution of Al similar to that of the region 20a1.

The regions 20a1 and 20a2 that contain lower Al concentration can reduce the turn on resistance ($R_{on}$) of the HEMT 100. The regions 20a1 and 20a2 that contain lower Al concentration can be beneficial to the performance of the HEMT 100.

The intrinsic $R_{on}$ of the HEMT 100 includes resistance $R_{ch}$ of the channel (i.e., 2DEG under the semiconductor gate 26), resistance $R_{ac}$ of the access region (i.e., 2DEG between semiconductor gate 26 and the source/drain regions in contact with the ohmit contacts 30 and 32, respectively), and resistance $R_c$ of source/drain contacts (i.e., between ohmit contacts 30/32 to the barrier layer 20). The regions 20a1 and 20a2 that contain lower Al concentration can reduce the resistance $R_c$, and thus reduce the $R_{on}$ of the HEMT 100. A typical HEMT may include a resistance $R_c$ of around $10^{-5}$ $\Omega$-cm$^2$. The HEMT 100 that includes the regions 20a1 and 20a2 can include a resistance $R_c$ of around $10^{-8}$ $\Omega$-cm$^2$, which is 1000 times lower than a typical HEMT.

The passivation layer 22 may include, for example, but is not limited to, oxides and/or nitrides, such as silicon nitride (SiN) and/or silicon oxide (SiO$_2$). In some embodiments, the passivation layer 22 may include silicon nitride and/or silicon oxide formed by a non-plasma film formation process. The passivation layer 24 may include materials similar to those of the passivation layer 22. In some embodiments, the passivation layer 24 may include materials identical to those of the passivation layer 22. In some embodiments, the passivation layer 24 may include materials different from those of the passivation layer 22.

The electrode 30 can be in contact with the barrier layer 20. The electrode 32 can be in contact with the barrier layer 20. An ohmic contact may be formed between electrode 30 and the barrier layer 20. An ohmic contact may be formed between electrode 32 and the barrier layer 20. The electrodes 30 and 32 each includes a portion embedded in the passivation layer 22. The electrodes 30 and 32 each includes a portion embedded in the passivation layer 24. In some embodiments, the electrodes 30 and 32 may include, for example, but are not limited to, titanium (Ti), aluminum (Al), Nickel (Ni), Gold (Au), Palladium (Pd), or any combinations or alloys thereof.

The semiconductor gate 26 may be disposed on the barrier layer 20. The semiconductor gate 26 may be in contact with the barrier layer 20. In some embodiments, the semiconductor gate 26 may include a group III-V layer. The semiconductor gate 26 may include, for example but not limited to, group III nitride, for example, a compound $Al_yGa_{(1-y)}N$, in which $y \leq 1$. In some embodiments, a material of the semiconductor gate 26 may include a p-type doped group III-V layer. In some embodiments, a material of the semiconductor gate 26 may include p-type doped GaN.

The gate conductor 28 can be in contact with the semiconductor gate 26. The gate conductor 28 can be in contact with the electrode 34. The gate conductor 28 may be covered by the passivation layer 22. The gate conductor 28 can be surrounded by the passivation layer 22. In some embodiments, the gate conductor 28 may include, for example, but is not limited to, titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

The electrode 34 can be in contact with the gate conductor 28. The electrode 34 may include a portion embedded within the passivation layer 22. The electrode 34 may include a portion surrounded by the passivation layer 22. In some embodiments, the electrode 34 may include materials similar to those of the electrodes 30 and 32.

Figure 1C:
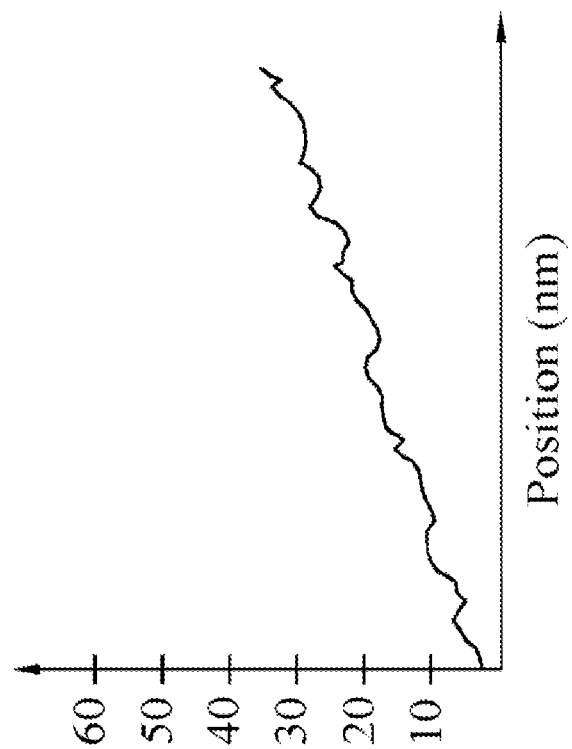
FIG. 1C illustrates a schematic view of a line scan result obtained by TEM along the arrow x2 as shown in FIG. 1A.
Figure 1B:
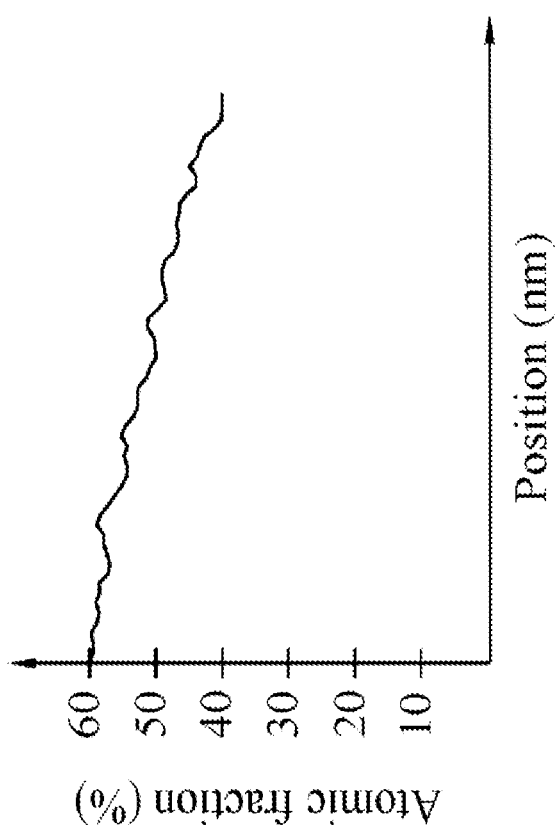
FIG. 1B illustrates a schematic view of a line scan result obtained by transmission electron microscope (TEM) along the arrow x1 as shown in FIG. 1A.

FIG. 1B illustrates a schematic view of a line scan result obtained by transmission electron microscope (TEM) along the arrow x1 as shown in FIG. 1A. The diagram shown in FIG. 1B can be obtained by the energy dispersive X-ray analyzer (EDX) of a TEM.

Referring to FIG. 1B, the concentration (i.e., the atomic fraction) of Al in the region 20b can be in a gradient distribution from the top surface 20s1 to the bottom surface 20s2. The concentration of Al in the region 20b gradually decreases from the top surface 20s1 to the bottom surface 20s2.

FIG. 1C illustrates a schematic view of a line scan result obtained by TEM along the arrow x2 as shown in FIG. 1A. The diagram shown in FIG. 1C can be obtained by the EDX of a TEM.

Referring to FIG. 1C, the concentration (i.e., the atomic fraction) of Al in the region 20a1 can be in a gradient distribution from the top surface 20s1 to the bottom surface 20s2. The concentration of Al in the region 20a1 gradually increases from the top surface 20s1 to the bottom surface 20s2.

Figure 2:
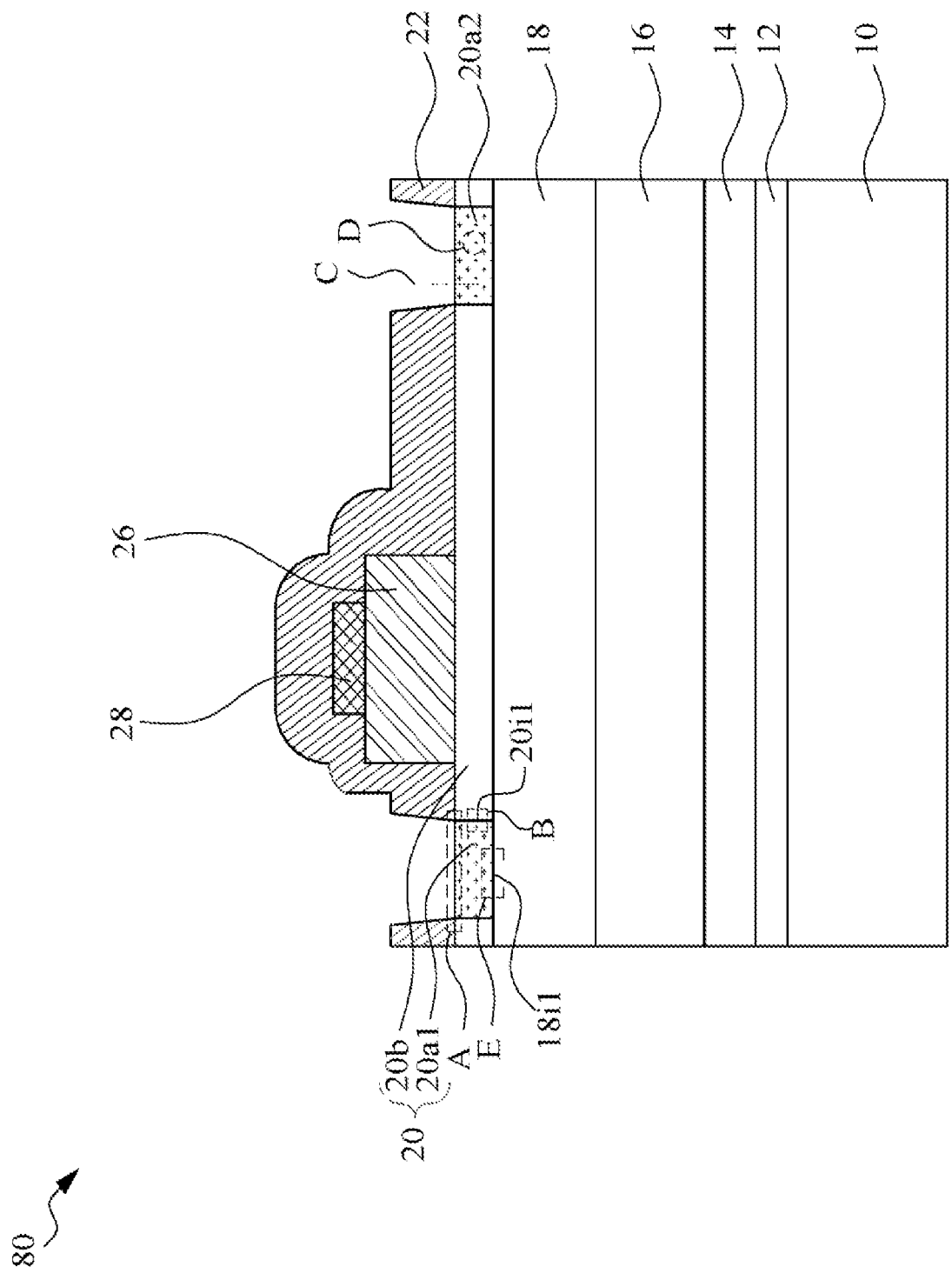
FIG. 2 illustrates a cross-sectional view of an interim structure of the semiconductor device as shown in FIG. 1A.

FIG. 2 illustrates a cross-sectional view of an interim structure of the semiconductor device as shown in FIG. 1A FIG. 2 shows a semiconductor structure 80. The semiconductor structure 80 can be a portion of the HEMT 100 shown in FIG. 1A.

The semiconductor structure 80 has a structure similar to that of the HEMT 100 shown in FIG. 1A, except that the semiconductor structure 80 does not include a passivation layer 24 and electrodes 30, 32 and 34. The semiconductor structure 80 can be obtained after the regions 20a1 and 20a2 are formed within the barrier layer 20 and before the electrodes 30 and 32 are formed.

Details regarding the structural characteristics of regions 20a1, 20b and 20a2 will be discussed in accordance with FIG. 2 and FIGS. 3A-3E. Referring to FIG. 2, an interface 18i1 exists between the channel layer 18 and the barrier layer 20, and an interface 20i1 exists between the region 20a1 and the region 20b.

Figure 3B:
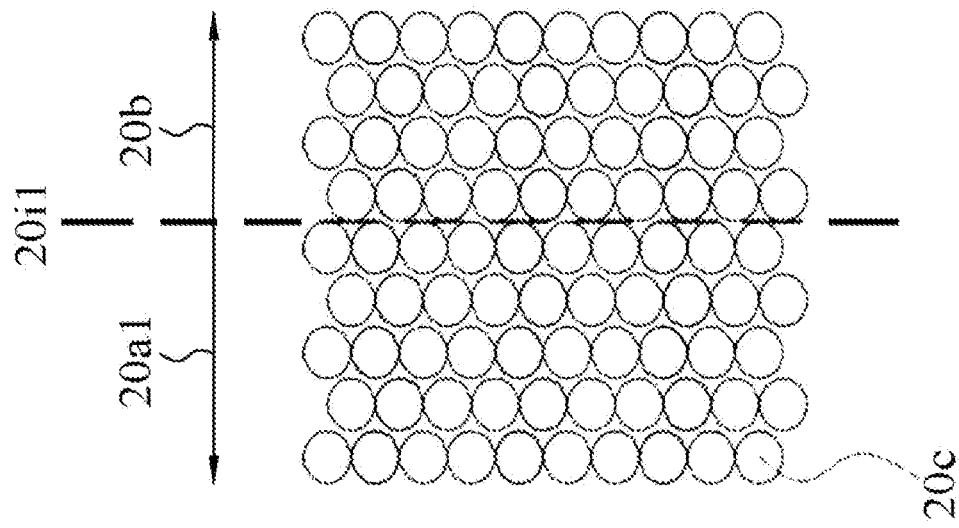
FIG. 3B illustrates a schematic view of the lattice arrangement in the dotted-rectangle B as shown in FIG. 2.
Figure 3A:
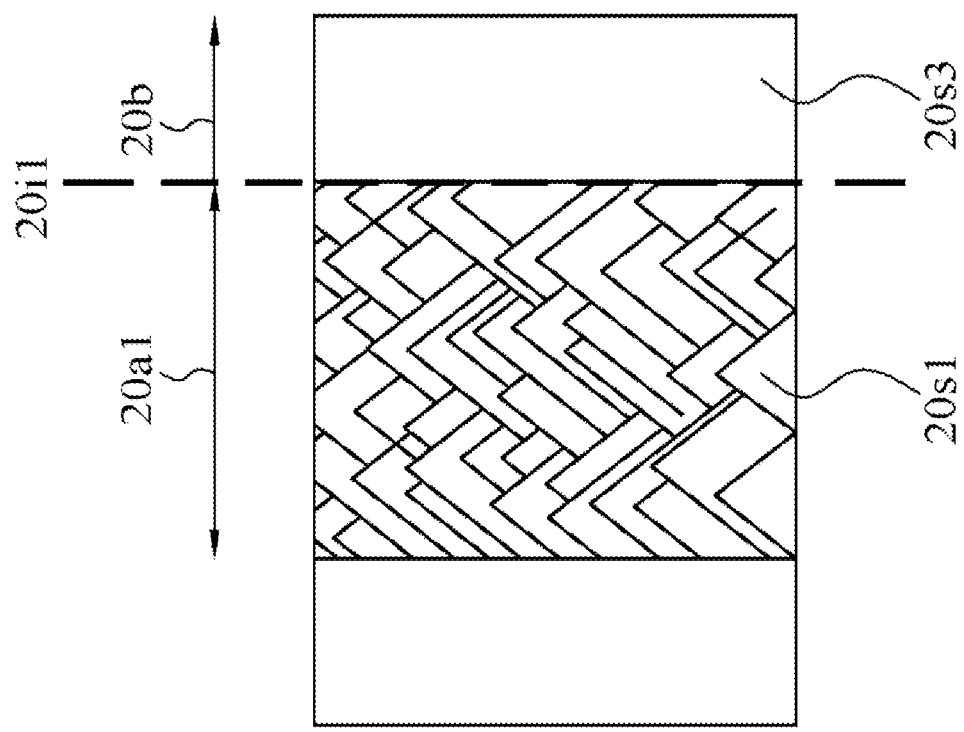
FIG. 3A illustrates an enlarged top view of the structure in the dotted-rectangle A as shown in FIG. 2.

An enlarged top view of the dotted-rectangle A will be shown in FIG. 3A. A schematic view of the dotted-rectangle B will be shown in FIG. 3B. An enlarged cross-sectional view along the dotted-line C will be shown in FIG. 3C. An enlarged view of the dotted-circle D will be shown in FIG. 3D. A schematic view of the dotted-rectangle E will be shown in FIG. 3E. Details regarding the structural characteristics around the interface 18i1 will be discussed in accordance with FIGS. 3A-3E. Details regarding the structural characteristics around the interface 20i1 will be discussed in accordance with FIGS. 3A-3E.

FIG. 3A illustrates an enlarged top view of a portion of a semiconductor structure according to some embodiments of the present disclosure. FIG. 3A shows a top view of a portion of the semiconductor structure 80 included in the dotted-rectangle A shown in FIG. 2. Referring to FIG. 3A, the top surface 20s1 of the region 20a1 may be relatively rough, and the top surface 20s3 of the region 20b may be relatively smooth. The interface 20i1 exists between the region 20a1 and the region 20b.

The region 20a1 may include nanostructures. The nanostructures of the region 20a1 can be formed during the manufacturing of the semiconductor structure 80, for example, by a wet-etching process. The region 20a1 may include nanostructures near the top surface 20s1. The region 20a1 may include nanostructures near the bottom surface 20s2 (see FIG. 1A). In some embodiments, the region 20a1 may include nanostructures across the top surface 20s1 and the bottom surface 20s2.

In some embodiments, the region 20a1 may include a diamond-shaped structure. In some embodiments, the region 20a1 may include a diamond-shaped structure near the top surface 20s1. In some embodiments, the region 20a1 may include a rectangular structure. In some embodiments, the region 20a1 may include a rectangular structure near the top surface 20s1.

In some embodiments, the region 20a1 may include pyramid-like structures. In some embodiments, the region 20a1 may include pyramid-like structures near the top surface 20s1. In some embodiments, the region 20a1 may include hexagonal pyramids. In some embodiments, the region 20a1 may include hexagonal pyramids near the top surface 20s1.

FIG. 3B illustrates a schematic view of the lattice arrangement in the dotted-rectangle B as shown in FIG. 2. FIG. 3B shows a schematic view of the lattice arrangement a portion of the semiconductor structure 80 near the interface 20i1.

FIG. 3B shows a plurality of crystals 20c regularly arranged. For simplicity of illustrations, the crystals 20c are depicted to be of circular shapes. Nevertheless, it can be contemplated that the crystals 20c of the barrier layer 20 can have different shapes of crystals, depending on the material constitutions of the barrier layer 20.

The region 20a1 may include single crystals. The region 20b may include single crystals. The barrier layer 20 may include single crystals near the interface 20i1. The region 20a1 can be devoid of polycrystalline structures. The region 20a1 can be devoid of polycrystalline structures near the interface 20i1. The region 20b can be devoid of polycrystalline structures near the interface 20i1. Similarly, the region 20a2 may include single crystals. The region 20a2 can be devoid of polycrystalline structures near an interface between the region 20a2 and the region 20b.

Figure 3C:
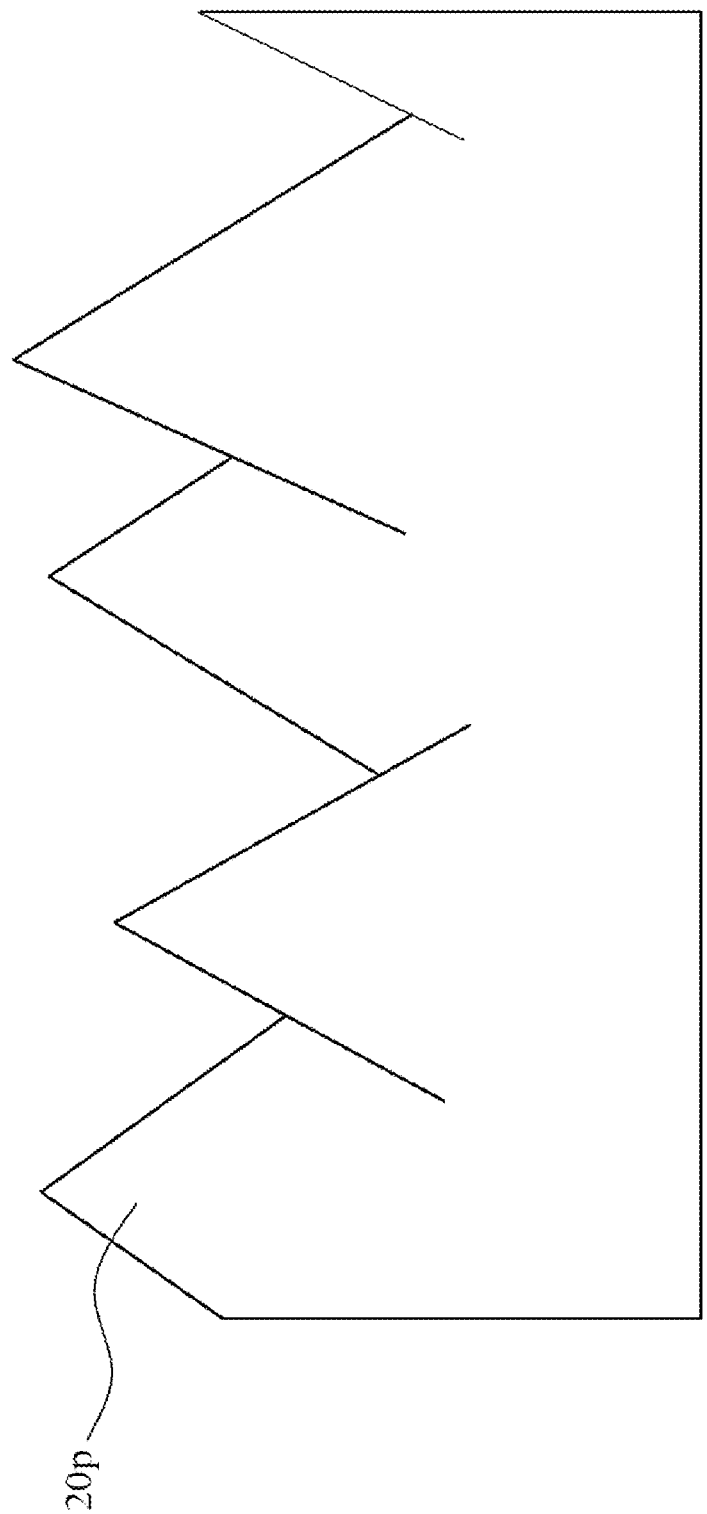
FIG. 3C illustrates a cross-sectional view of the structure along the dotted-line C as shown in FIG. 2.

FIG. 3C illustrates a cross-sectional view of a portion of a semiconductor structure according to some embodiments of the present disclosure. FIG. 3C shows a cross-sectional view of a portion of the semiconductor structure 80 along the dotted-line C shown in FIG. 2.

Referring to FIG. 3C, the region 20a2 (and also the region 20a1) may include a pyramid-like structure 20p. In some embodiments, the region 20a2 (and also the region 20a1) may include mountain-like structures. In some embodiments, the region 20a2 (and also the region 20a1) may include triangular structures. The pyramid-like structure 20p can be formed during the manufacturing of the semiconductor structure 80, for example, by a wet-etching process.

Figure 3D:
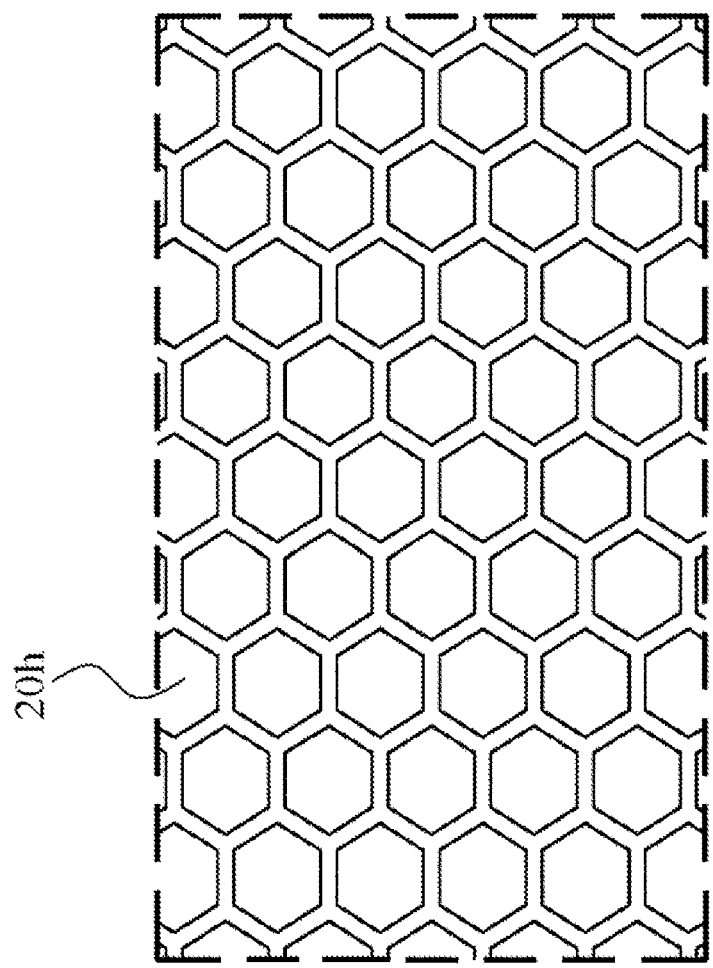
FIG. 3D illustrates an enlarged view of the structure in the dotted-circle D as shown in FIG. 2.

FIG. 3D illustrates an enlarged view of a portion of a semiconductor structure according to some embodiments of the present disclosure. FIG. 3D shows an enlarged view of a portion of the semiconductor structure 80 included in the dotted-circle D shown in FIG. 2.

Referring to FIG. 3D, the region 20a2 (and also the region 20a1) may contain voids or pores 20h. The voids or pores 20h can be formed during the manufacturing of the semiconductor structure 80, for example, by a wet-etching process. In some embodiments, the voids or pores included in the regions 20a1 and 20a2 can be uniform in size. In some embodiments, the voids or pores included in the regions 20a1 and 20a2 can have different sizes.

In some embodiments, the shapes of the voids or pores 20h can be regular. In some embodiments, the shapes of the voids or pores 20h can be irregular.

The shapes of the voids or pores 20h can be triangle. The shapes of the voids or pores 20h can be quadrangle. The shapes of the voids or pores 20h can be pentagon. The shapes of the voids or pores 20h can be hexagon. The shapes of the voids or pores 20h can be heptagon. The shapes of the voids or pores 20h can be octagon. The shapes of the voids or pores 20h can be enneagon. The shapes of the voids or pores 20h can be decagon. The shapes of the voids or pores 20h can be polygon.

Figure 3E:
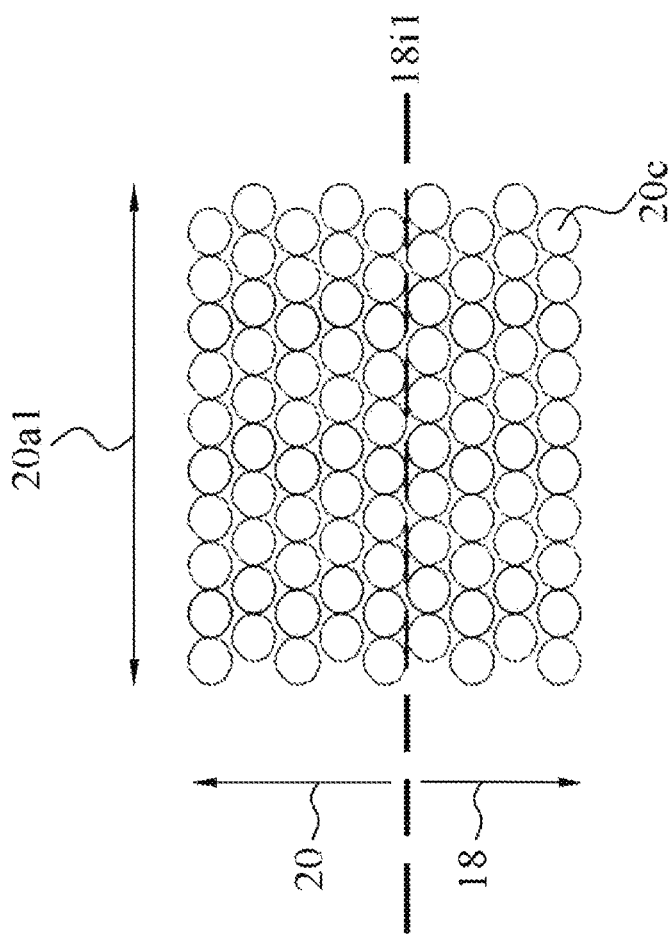
FIG. 3E illustrates a schematic view of the lattice arrangement in the dotted-rectangle E as shown in FIG. 2.

FIG. 3E illustrates a schematic view of the lattice arrangement in the dotted-rectangle E as shown in FIG. 2. FIG. 3E shows a schematic view of a portion of the semiconductor structure 80 near the interface 18i1.

FIG. 3E shows a plurality of crystals 20c regularly arranged. For simplicity of illustration, the crystals 20c are depicted to be of circular shape. Nevertheless, it can be contemplated that the crystals 20c of the barrier layer 20 can have different shapes of crystals, depending on the material constitutions of the channel layer 18 and the barrier layer 20.

Referring to FIG. 3E, the channel layer 18 may include single crystals. The barrier layer 20 may include single crystals. The region 20a1 may include single crystals. The channel layer 18 may include single crystals near the interface 18i1. The barrier layer 20 may include single crystals near the interface 18i1.

The single crystals in the barrier layer 20 may take over a crystal structure of the channel layer 18. The single crystals in the region 20a1 may take over a crystal structure of the channel layer 18. The term "take over" used in the present disclosure may refer to the crystal structure of one layer following the crystal structure of another layer. The term "take over" used in the present disclosure may refer to the crystal structure of one layer being identical to the crystal structure of another layer.

The barrier layer 20 can be devoid of polycrystalline structures. The barrier layer 20 can be devoid of polycrystalline structures near the interface 18i1. The region 20a1 can be devoid of polycrystalline structures. The region 20a1 can be devoid of polycrystalline structures near the interface 18i1.

The channel layer 18 can be devoid of polycrystalline structures. The channel layer 18 can be devoid of polycrystalline structures near the interface 18i1. Similarly, the region 20b can be devoid of polycrystalline structures near an interface between the channel layer 18 and the barrier layer 20. The region 20a2 can be devoid of polycrystalline structures near an interface between the channel layer 18 and the barrier layer 20.

FIGS. 4A, 4B, 4C, 4D, 4E, 4F, 4G, 4H and 4I illustrate operations for fabricating a semiconductor device according to some embodiments of the present disclosure. The operations shown in FIGS. 4A, 4B, 4C, 4D, 4E, 4F, 4G, 4H and 4I can be performed to produce the HEMT 100 shown in FIG. 1A.

Figure 4A:
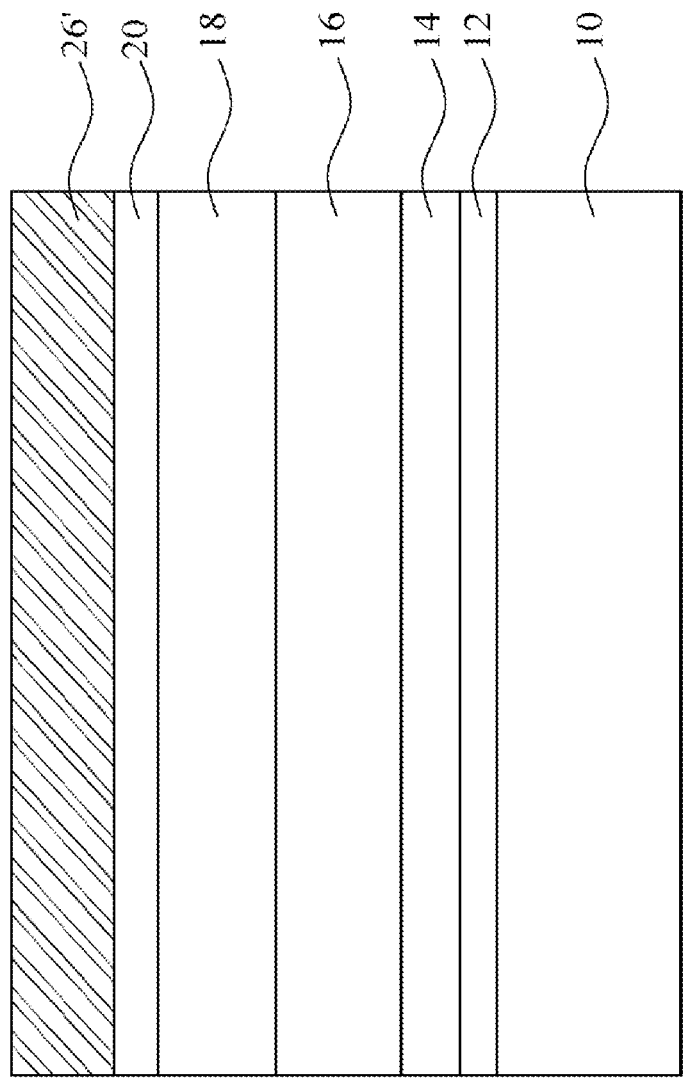
FIGS. 4A, 4B, 4C, 4D, 4E, 4F, 4G, 4H and 4I illustrate operations for fabricating a semiconductor device according to some embodiments of the present disclosure.

Referring to FIG. 4A, a substrate 10 is provided. In some embodiments, the substrate 10 may include a silicon material or sapphire. Next, a seed layer 12 is formed on the substrate 10, a buffer layer 14 is formed on the seed layer 12, and an electron blocking layer 16 is formed on the buffer layer 14. A channel layer 18 is formed on the electron blocking layer 16, and then a barrier layer 20 is formed on the channel layer 18. Next, a semiconductor gate material layer 26' is formed on the barrier layer 20.

The substrate 10 may include materials as discussed in accordance with the HEMT 100 of FIG. 1A. The seed layer 12 may include materials as discussed in accordance with the HEMT 100 of FIG. 1A. The buffer layer 14 may include materials as discussed in accordance with the HEMT 100 of FIG. 1A. The electron blocking layer 16 may include materials as discussed in accordance with the HEMT 100 of FIG. 1A.

In some embodiments, a material of the channel layer 18 may include GaN, a material of the barrier layer 20 may include AlGaN, and a material of the semiconductor gate material layer 26' may include GaN. In some embodiments, the channel layer 18, the barrier layer 20, and/or the semiconductor gate material layer 26' may be formed by chemical vapor deposition (CVD), physical vapor deposition (PVD), epitaxial growth, or other suitable deposition processes.

Figure 4B:
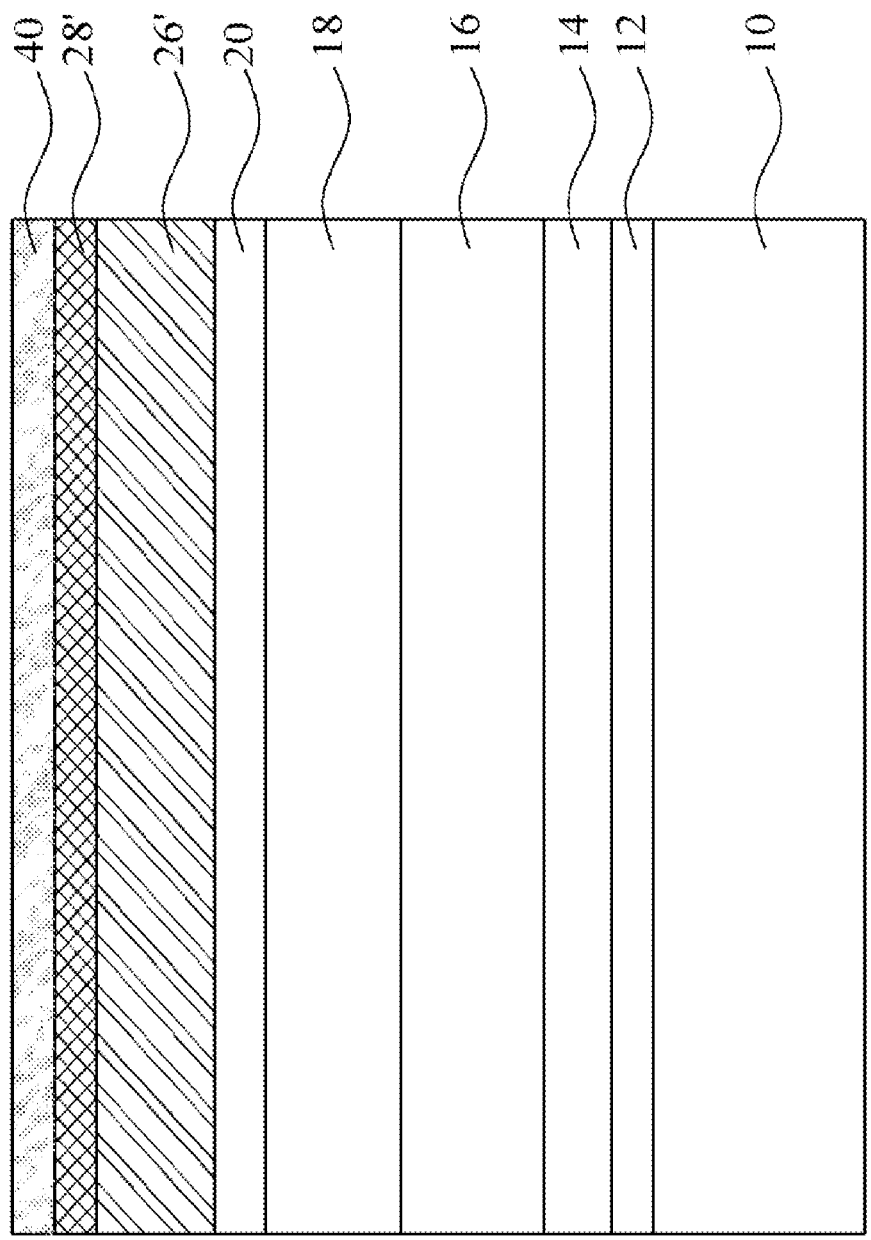

Referring to FIG. 4B, a gate conductor material layer 28' is formed on the substrate 10 semiconductor gate material layer 26', and a hardmask layer 40 is formed on the gate conductor material layer 28'. In some embodiments, one or more layers of materials may be deposited by PVD, CVD, and/or other suitable processes to form the gate conductor material layer 28'. In some embodiments, the gate conductor material layer 28' may be formed by sputtering or evaporating a metal material on the semiconductor gate material layer 26'.

Figure 4C:
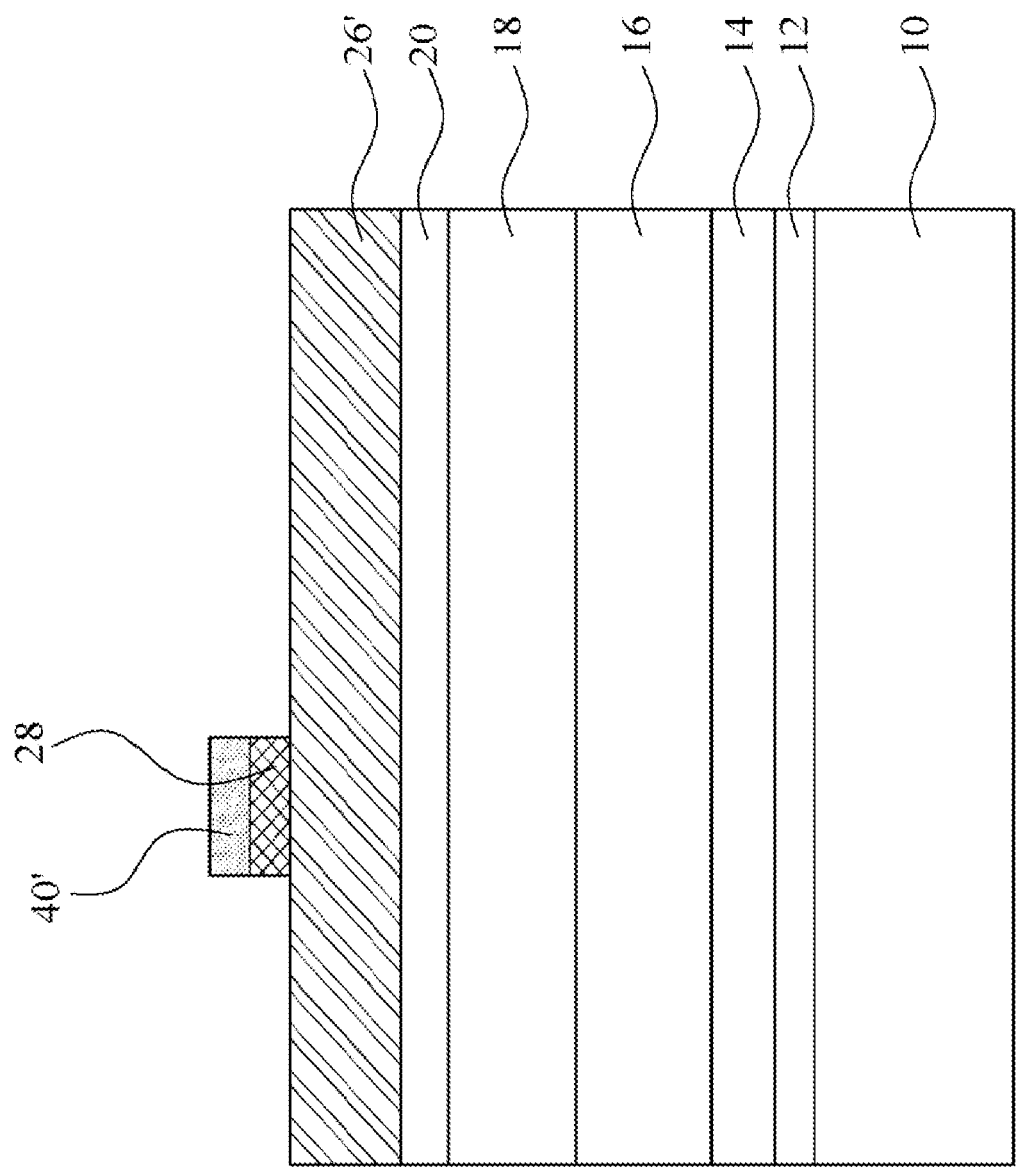

Referring to FIG. 4C, a patterning process may be performed on the hardmask layer 40 and the gate conductor material layer 28' to form a gate conductor 28. A patterned hardmask 40' can be first formed above the gate conductor material layer 28', and then the portions of the gate conductor material layer 28' that are not covered by the patterned hardmask 40' can be removed. In some embodiments, the gate conductor material layer 28' may be patterned by dry etching. In some embodiments, the gate conductor material layer 28' may be patterned by wet etching. The etching process conducted on the gate conductor material layer 28' may stop on the top surface of the semiconductor gate material layer 26'. The etching process conducted on the gate conductor material layer 28' may continue until the top surface of the semiconductor gate material layer 26' is exposed.

Figure 4D:
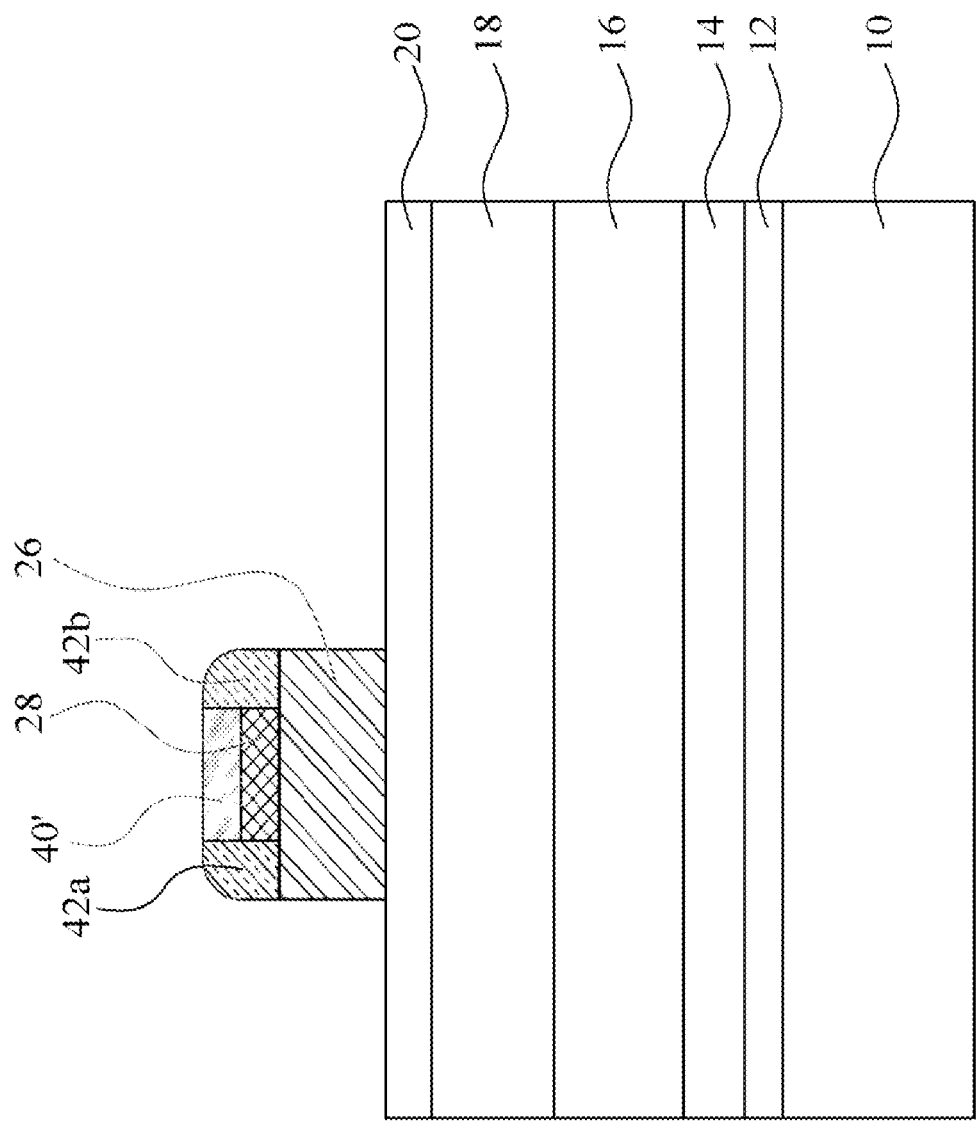

Referring to FIG. 4D, spacers 42a and 42b are formed adjacent to the patterned hardmask 40' and the gate conductor 28. Next, the portions of the semiconductor gate material layer 26' that are not covered by the spacers 42a and 42b and the gate conductor 28 are removed to form the semiconductor gate 26.

In some embodiments, the semiconductor gate material layer 26' may be patterned by dry etching. In some embodiments, the semiconductor gate material layer 26' may be patterned by wet etching. The etching process conducted on the semiconductor gate material layer 26' may stop on the top surface of the barrier layer 20. The etching process conducted on the semiconductor gate material layer 26' may continue until the top surface of the barrier layer 20 is exposed.

Figure 4E:
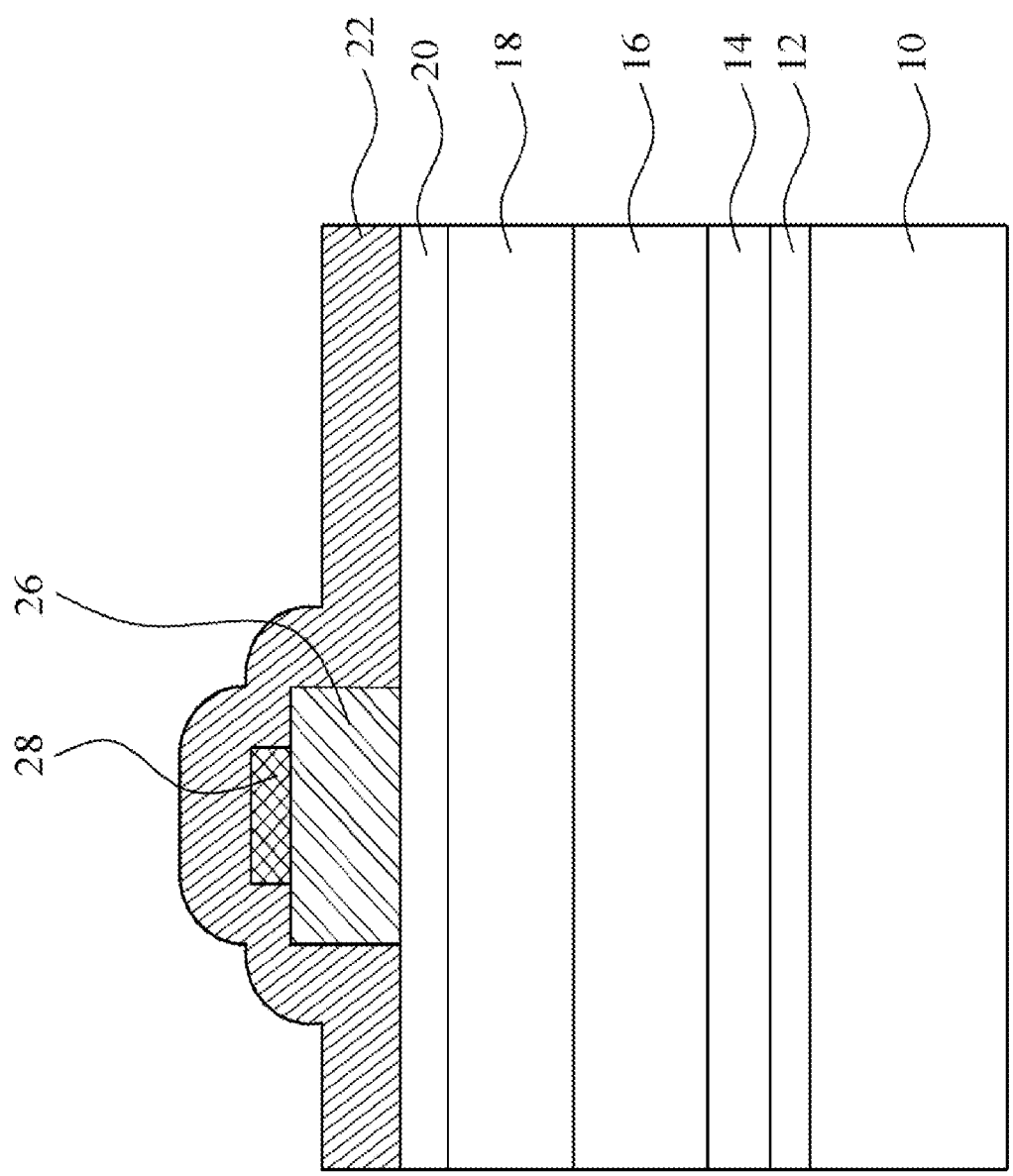

Referring to FIG. 4E, the spacers 42a and 42b are removed, and the patterned hard mask 40' is also removed. Next, a passivation layer 22 is disposed to cover the barrier layer 20, the semiconductor gate 26 and the gate conductor 28. In some embodiments, the passivation layer 22 can be conformally formed above the barrier layer 20, the semiconductor gate 26 and the gate conductor 28. In some embodiments, the passivation layer 22 may include, for example, but is not limited to, oxides and/or nitrides, such as silicon nitride (SiN) and/or silicon oxide ($SiO_2$). In some embodiments, the passivation layer 22 may include silicon nitride and/or silicon oxide formed by a non-plasma film formation process.

Figure 4F:
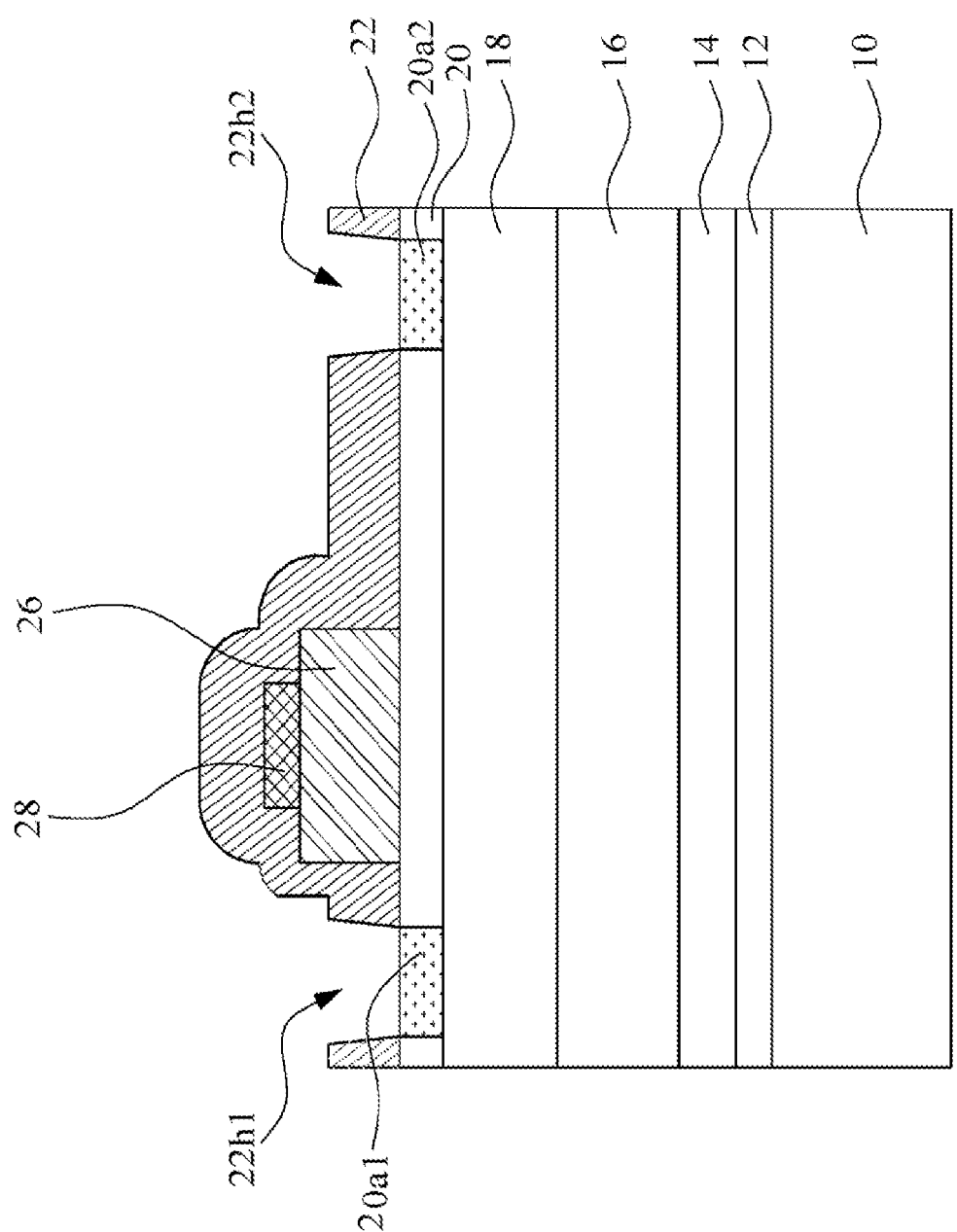

Referring to FIG. 4F, openings 22h1 and 22h2 can be formed on the passivation layer 22. The opening 22h1 exposes a portion of the barrier layer 20. The opening 22h1 exposes an upper surface of the region 20a1 of the barrier layer 20. The opening 22h2 exposes a portion of the barrier layer 20. The opening 22h2 exposes an upper surface of the region 20a2 of the barrier layer 20.

The barrier layer 20 may include a compound $Al_yGa_{(1-y)}N$, in which $y \leq 1$.

Etching technique, for example but is not limited to wet soaking technique, can be applied to the region 20a1 and the region 20a2. Etchant applied to the region 20a1 and the region 20a2 can include hydroxides, which has a relatively great etching rate on aluminum nitride (AlN) than Gallium nitride (GaN). Relatively great aluminum are removed than other elements (e.g. gallium and nitrogen) subsequent to the etching operation. In other words, the aluminum (Al) concentration in the region 20a1 and the region 20a2 is reduced after the etching operation.

Etchant that can be used in the operation as discussed can include, for example but is not limited to, hydroxides, sodium hydroxide (NaOH), potassium hydroxide (KOH), AZ400K photoresist developer, or other suitable solution(s). Etchant that can be used in the operation as discussed can include a relatively high selectivity between aluminum and other elements (e.g. gallium or nitrogen).

According to experiment results, sodium hydroxide (NaOH) has an AlN etch rate of 50 nanometers per minute at a temperature of 75° C., while it barely etches Gallium nitride (GaN). According to experiment results, potassium hydroxide (KOH) has an AlN etch rate of 2265 nanometers per minute, while it barely etches Gallium nitride (GaN). According to experiment results, AZ400K photoresist developer has an AlN etch rate around 6 to 1000 nanometers per minute, while it barely etches Gallium nitride (GaN).

After the etching operation, the region 20a1 and the region 20a2 can have an Al concentration lower than the other portions of the barrier layer 20.

Referring back to FIG. 1A, the regions 20a1 and 20a2 of the HEMT 100 can be etched in a way similar to the operation(s) as described and illustrated with reference to FIG. 4F. Accordingly, the regions 20a1 and 20a2 of the HEMT 100 can have a relatively low Al concentration, which can reduce the turn on resistance ($R_{on}$) of the HEMT 100 to improve the performance thereof.

Referring to FIG. 4F, after the removal of aluminum, the crystal structure within the region 20a1 and the region 20a2 remains the same. In other words, the removal of aluminum does not change the crystal structure of barrier layer 20 within the region 20a1 and the region 20a2. For example, the crystal orientation of the region 20a1 can still be the same as that of the channel layer 18. For example, the crystal orientation of the region 20a1 can still be the same as that of the barrier layer 20. For example, the crystal orientation of the region 20a2 can still be the same as that of the channel layer 18. For example, the crystal orientation of the region 20a2 can still be the same as that of the barrier layer 20. Identical crystal orientation across the regions 20a1, 20a2, the barrier layer 20 and the channel layer 18 can be beneficial to the yield rate of the HEMT to be produced. Identical crystal orientation across the regions 20a1, 20a2, the barrier layer 20 and the channel layer 18 can be beneficial to the reliability of the HEMT to be produced.

In some embodiments, the region 20a1 and the region 20a2 can be treated by dry ashing techniques to reduce the concentration of Al in the region 20a1 and the region 20a2. For example, $O_2$, $N_2$, $H_2$, or other suitable element(s), gas, or plasma, either alone or in combination, can be used to reduce the concentration of Al in the region 20a1 and the region 20a2. For example, the region 20a1 and the region 20a2 can be treated by dry ashing with plasma of one of $O_2$, $N_2$ or $H_2$. For example, the region 20a1 and the region 20a2 can be treated by dry ashing using plasma of any combination of $O_2$, $N_2$ and $H_2$.

In some other embodiments, residues may exist within the regions 20a1 and 20a2 after the dry ashing operation (not illustrated in FIG. 4F). In some other embodiments, residues may exist within the barrier layer 20 after the dry ashing operation (not illustrated in FIG. 4F). In some other embodiments, residues may exist within the passivation layer 22 and the channel layer 18 after the dry ashing operation (not illustrated in FIG. 4F).

The region 20a1 and the region 20a2 can be treated with both dry ashing techniques and wet soaking techniques. For example, the region 20a1 and the region 20a2 can be first treated with wet soaking techniques, and then the dry ashing techniques may follow, or vice versa.

Figure 4G:
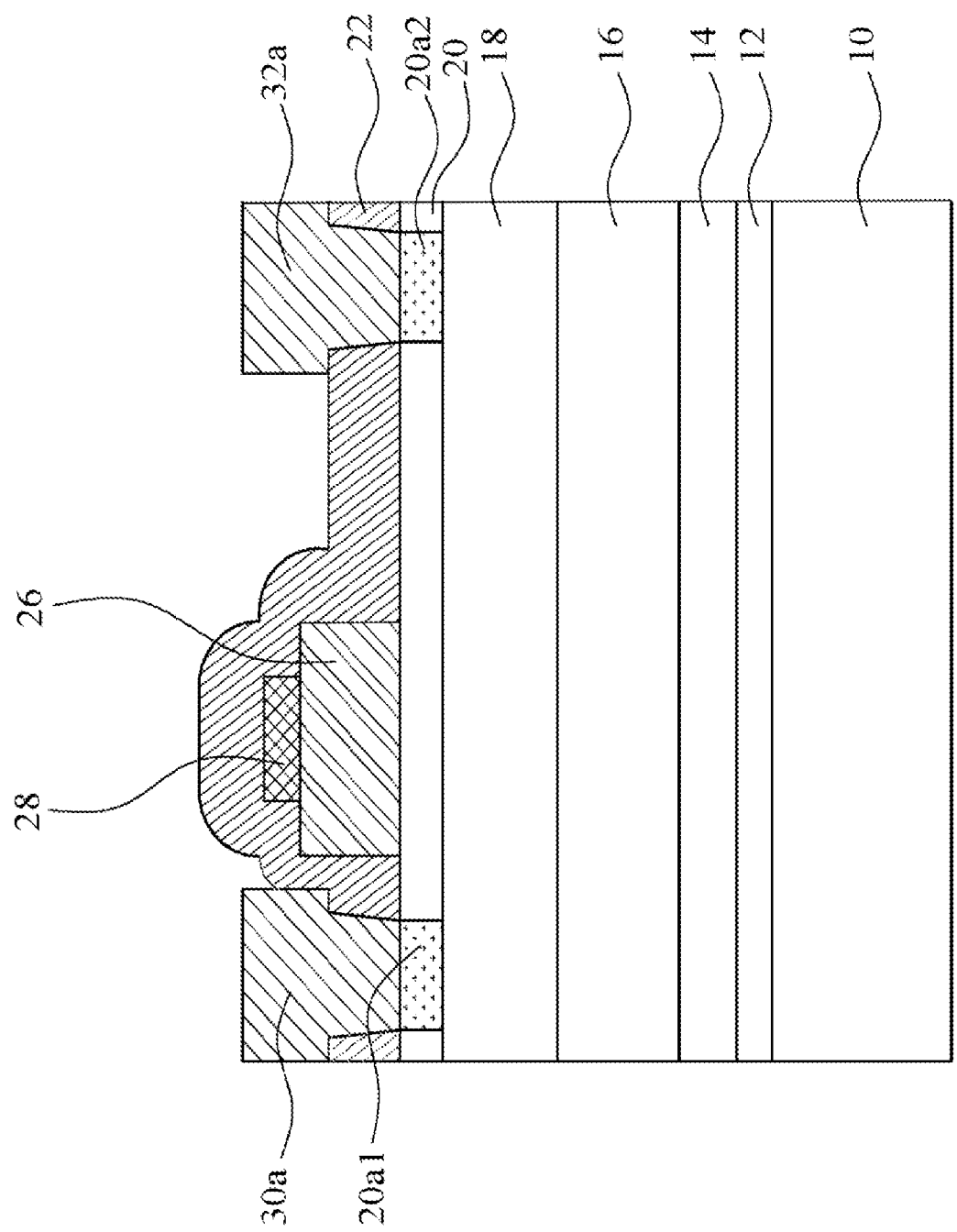

Referring to FIG. 4G, conductors 30a and 32a can be formed. The conductor 30a can be formed within the opening 22h1 and in contact with the region 20a1. The conductor 32a can be formed within the opening 22h2 and in contact with the region 20a2. A portion of the conductor 30a can be surrounded by the passivation layer 22. A portion of the conductor 32a can be surrounded by the passivation layer 22.

In some embodiments, the conductors 30a and 32a can be formed using techniques, for example, but not limited to, soldering, welding, crimping, deposition, or electroplating. In some embodiments, the conductors 30a and 32a may include, for example, but are not limited to, titanium (Ti), Aluminium (Al), Nickel (Ni), Gold (Au), Palladium (Pd), or any combinations or alloys thereof.

Figure 4H:
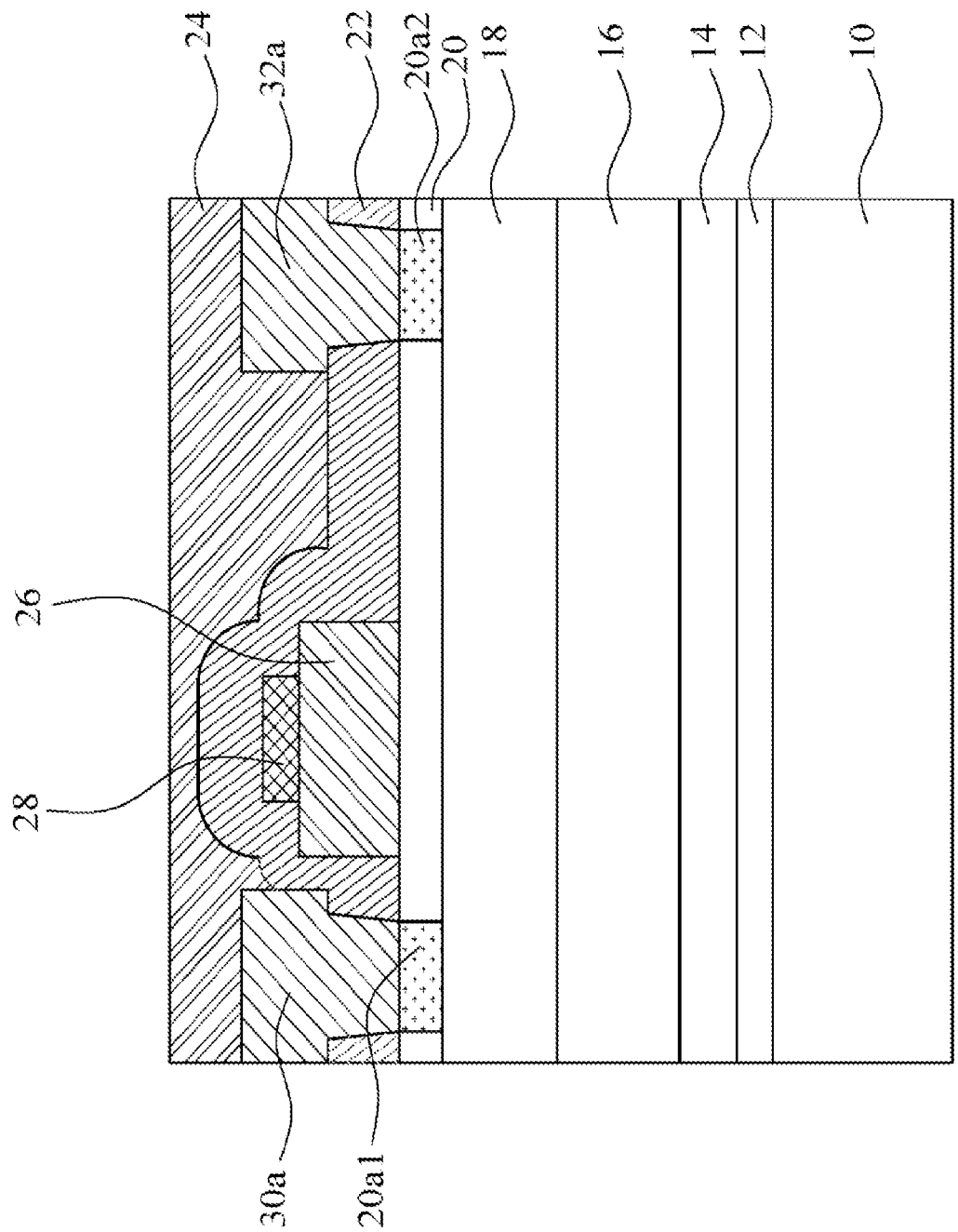

Referring to FIG. 4H, a passivation layer 24 is formed. The passivation layer 24 is disposed above and covers the conductors 30a and 32a and the passivation layer 22. The passivation layer 24 may include, for example, but is not limited to, oxides and/or nitrides, such as silicon nitride (SiN) and/or silicon oxide (SiO2). In some embodiments, the passivation layer 24 may include silicon nitride and/or silicon oxide formed by a non-plasma film formation process. The passivation layer 24 may include materials similar to those of the passivation layer 22. In some embodiments, the passivation layer 24 may include materials identical to those of the passivation layer 22. In some embodiments, the passivation layer 24 may include materials different from those of the passivation layer 22.

Figure 4I:
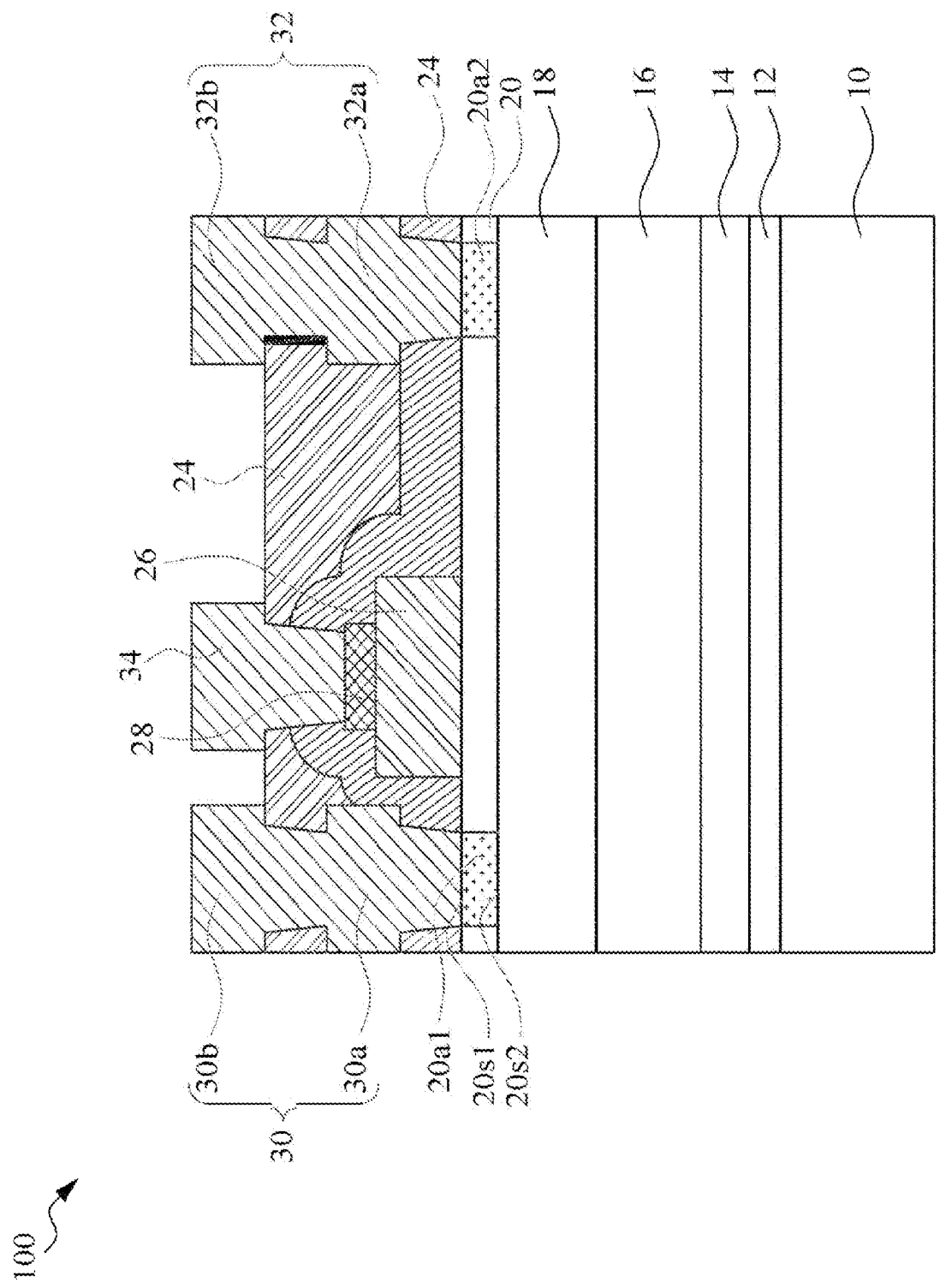

Referring to FIG. 4I, conductors 30b and 32b and electrode 34 can be formed. The conductor 30b is formed above and in contact with the conductor 30a. The conductors 30a and 30b form the electrode 30. The conductor 32b is formed above and in contact with the conductor 32a. The conductors 32a and 32b form the electrode 32. The electrodes 30, 32 and 34 are exposed by the passivation layer 24. The electrodes 30, 32 and 34 are not covered by the passivation layer 24.

A HEMT 100 can be obtained after the operations described in accordance with FIGS. 4A, 4B, 4C, 4D, 4E, 4F, 4G, 4H and 4I are performed.

FIGS. 5A, 5B, 5C, 5D, 5E, 5F, 5G, 5H, 5I and 5J illustrate operations for fabricating a semiconductor device according to some other embodiments of the present disclosure. The operations shown in FIGS. 5A, 5B, 5C, 5D, 5E, 5F, 5G, 5H, 5I and 5J can be performed to produce a HEMT 100' shown in FIG. 5J.

Figure 5A:
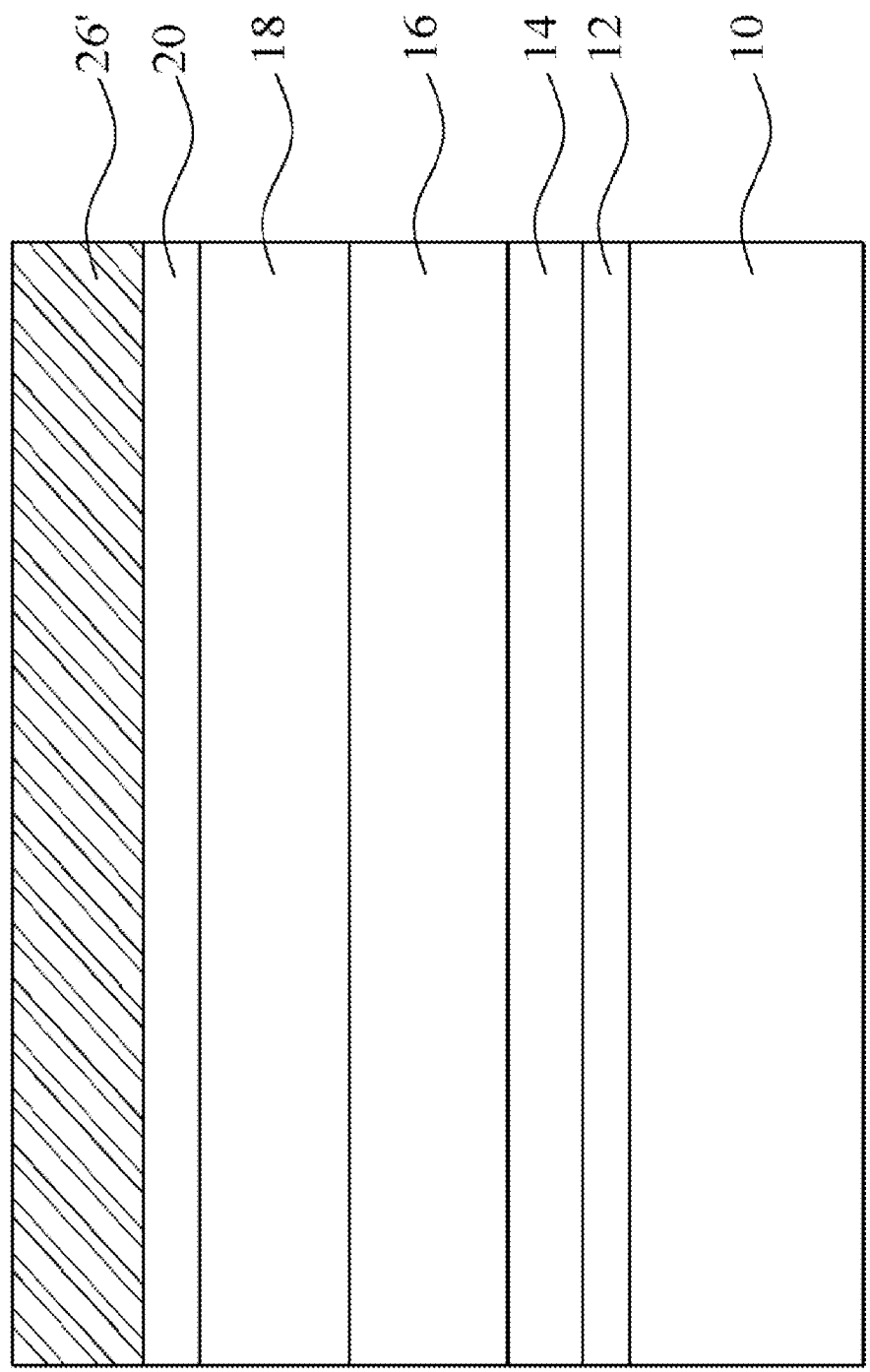

Referring to FIG. 5A, a substrate 10 is provided. In some embodiments, the substrate 10 may include a silicon material or sapphire. Next, a seed layer 12 is formed on the substrate 10, a buffer layer 14 is formed on the seed layer 12, and an electron blocking layer 16 is formed on the buffer layer 14. A channel layer 18 is formed on the electron blocking layer 16, and then a barrier layer 20 is formed on the channel layer 18. Next, a semiconductor gate material layer 26' is formed on the barrier layer 20.

In some embodiments, a material of the channel layer 18 may include GaN, a material of the barrier layer 20 may include AlGaN, and a material of the semiconductor gate material layer 26' may include GaN. In some embodiments, the channel layer 18, the barrier layer 20, and/or the semiconductor gate material layer 26' may be formed by chemical vapor deposition (CVD), physical vapor deposition (PVD), epitaxial growth, or other suitable deposition processes.

Figure 5B:
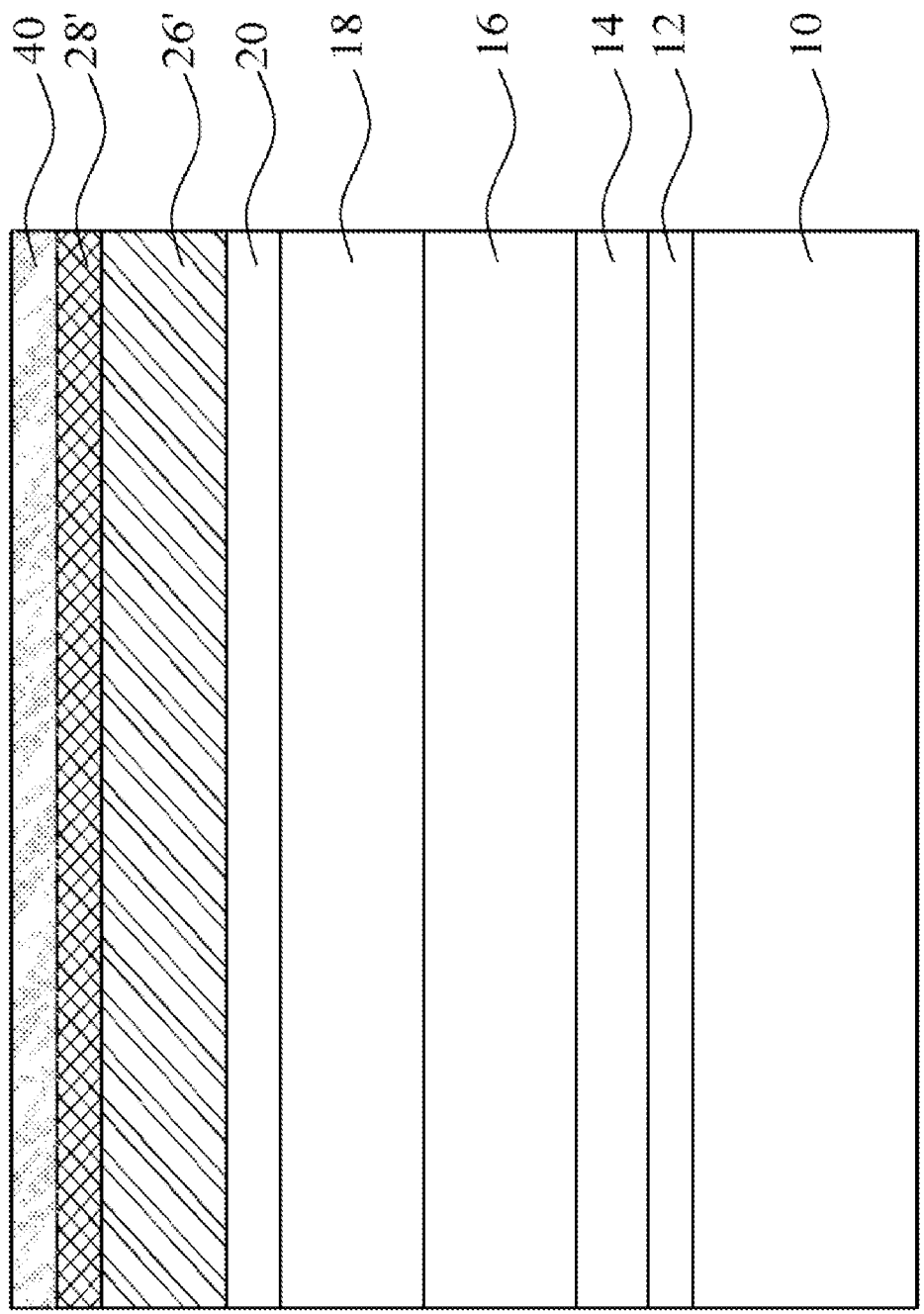

Referring to FIG. 5B, a gate conductor material layer 28' is formed on the substrate 10 semiconductor gate material layer 26', and a hardmask layer 40 is formed on the gate conductor material layer 28'. In some embodiments, one or more layers of materials may be deposited by PVD, CVD, and/or other suitable processes to form the gate conductor material layer 28'. In some embodiments, the gate conductor material layer 28' may be formed by sputtering or evaporating a metal material on the semiconductor gate material layer 26'.

Referring to FIG. 5C, a patterning process may be performed on the hardmask layer 40 and the gate conductor material layer 28' to form a gate conductor 28. The operation shown in FIG. 5C is similar to that shown in FIG. 4C, and thus the details will not be repeated here.

Figure 5D:
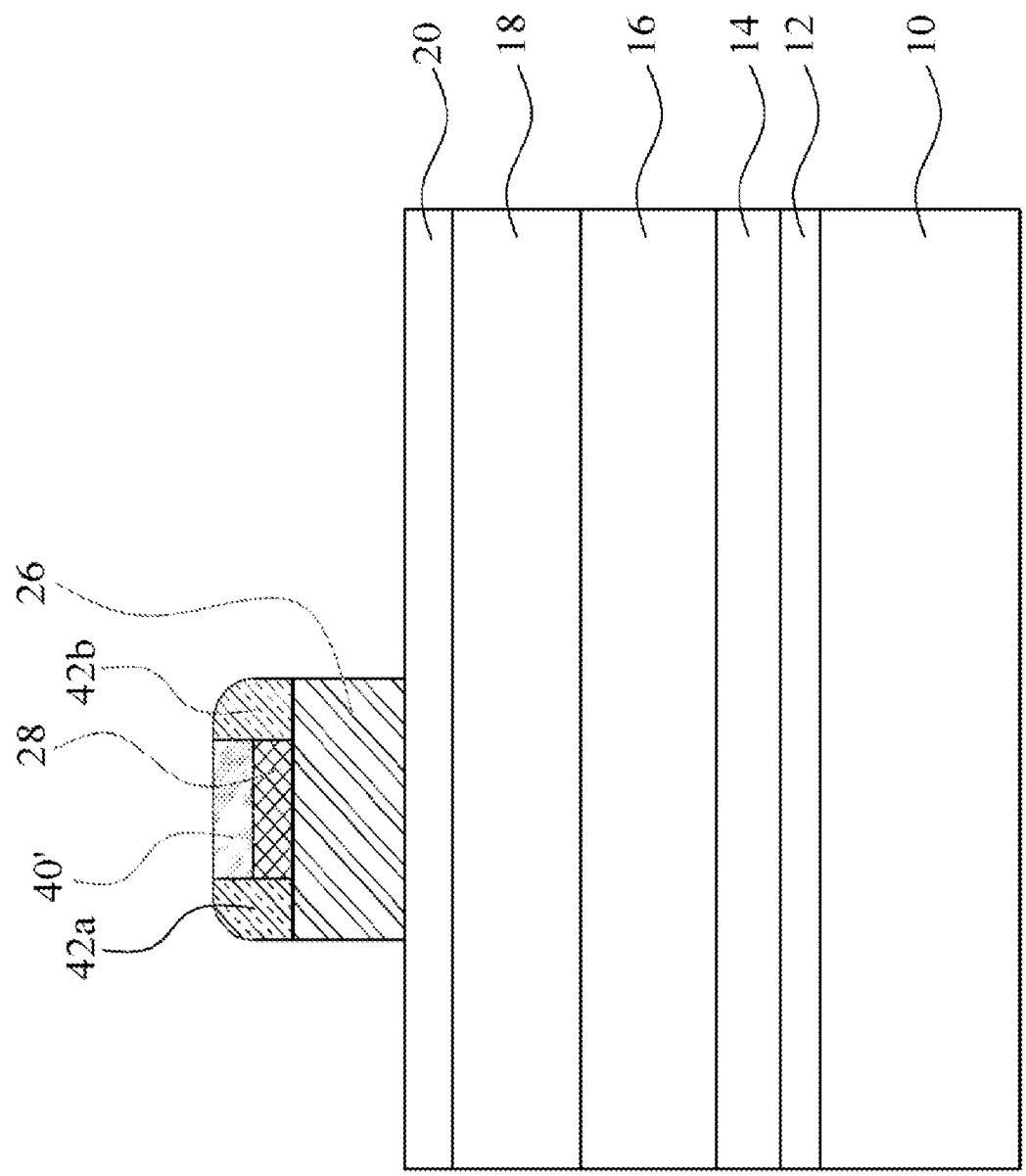

Referring to FIG. 5D, spacers 42a and 42b are formed adjacent to the patterned hardmask 40' and the gate conductor 28. Next, the semiconductor gate 26 is formed. The operation shown in FIG. 5D is similar to that shown in FIG. 4D, and thus the details will not be repeated here.

Figure 5E:
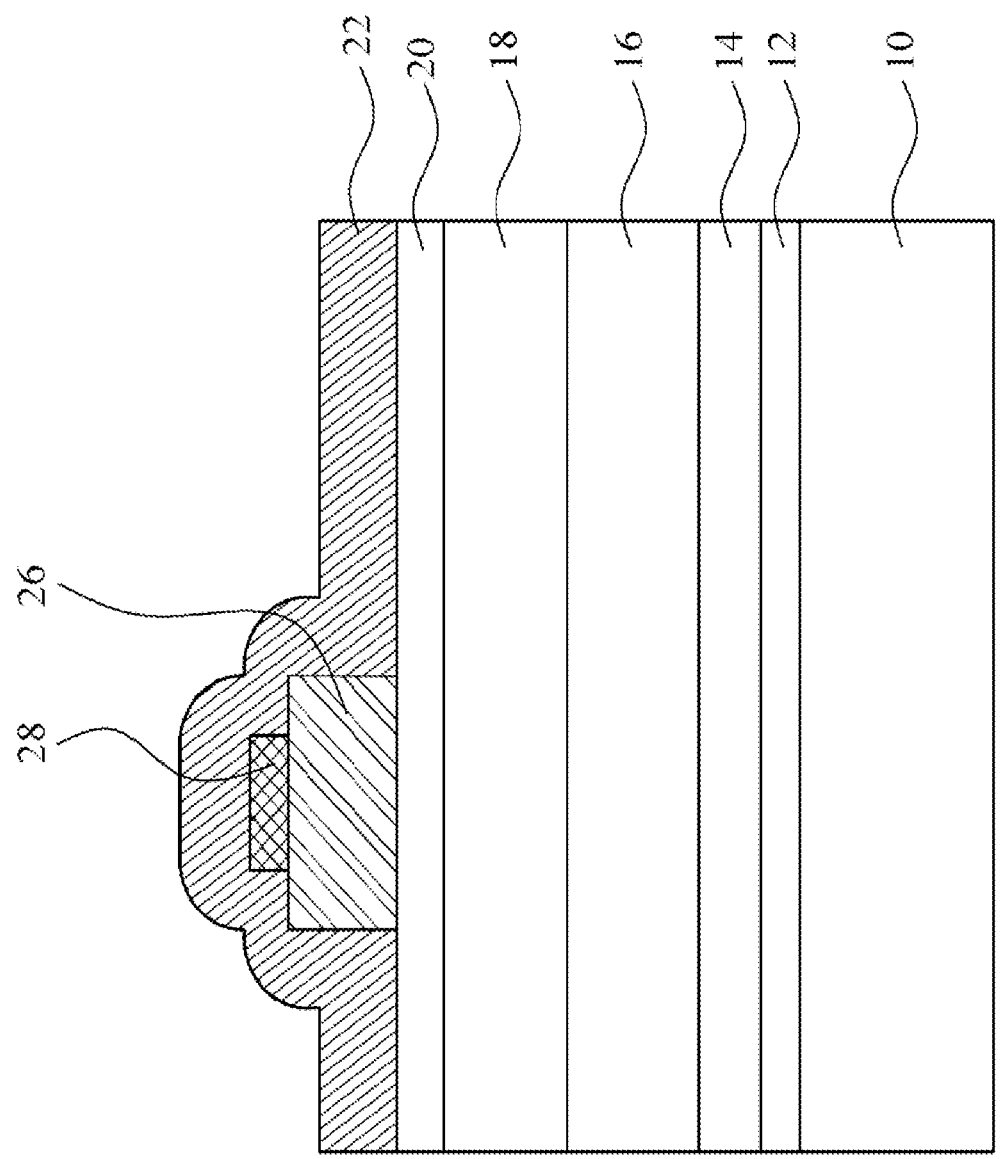

Referring to FIG. 5E, the spacers 42a and 42b are removed, and the patterned hardmask 40' is also removed. Next, a passivation layer 22 is disposed to cover the barrier layer 20, the semiconductor gate 26 and the gate conductor 28. The operation shown in FIG. 5E is similar to that shown in FIG. 4E, and thus the details will not be repeated here.

Figure 5F:
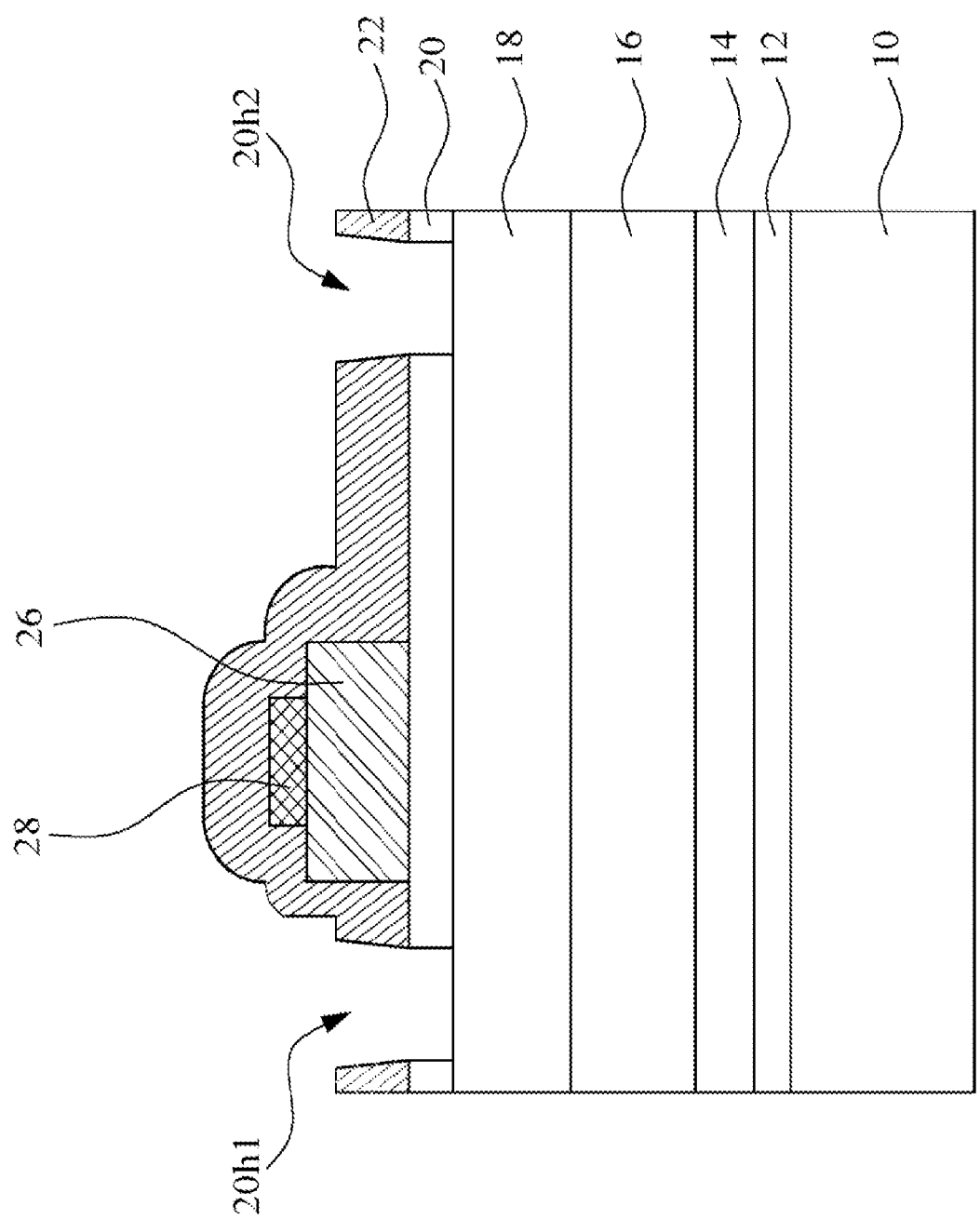

Referring to FIG. 5F, openings 20h1 and 20h2 are formed. The opening 20h1 can penetrate the passivation layer 22 and the barrier layer 20. The opening 20h2 can penetrate the passivation layer 22 and the barrier layer 20. The opening 20h1 exposes a portion of the channel layer 18. The opening 20h1 exposes a surface of the channel layer 18. The opening 20h2 exposes a portion of the channel layer 18. The opening 20h2 exposes a surface of the channel layer 18. The openings 20h1 and 20h2 can be formed by, for example, wet etching or dry etching techniques.

Figure 5G:
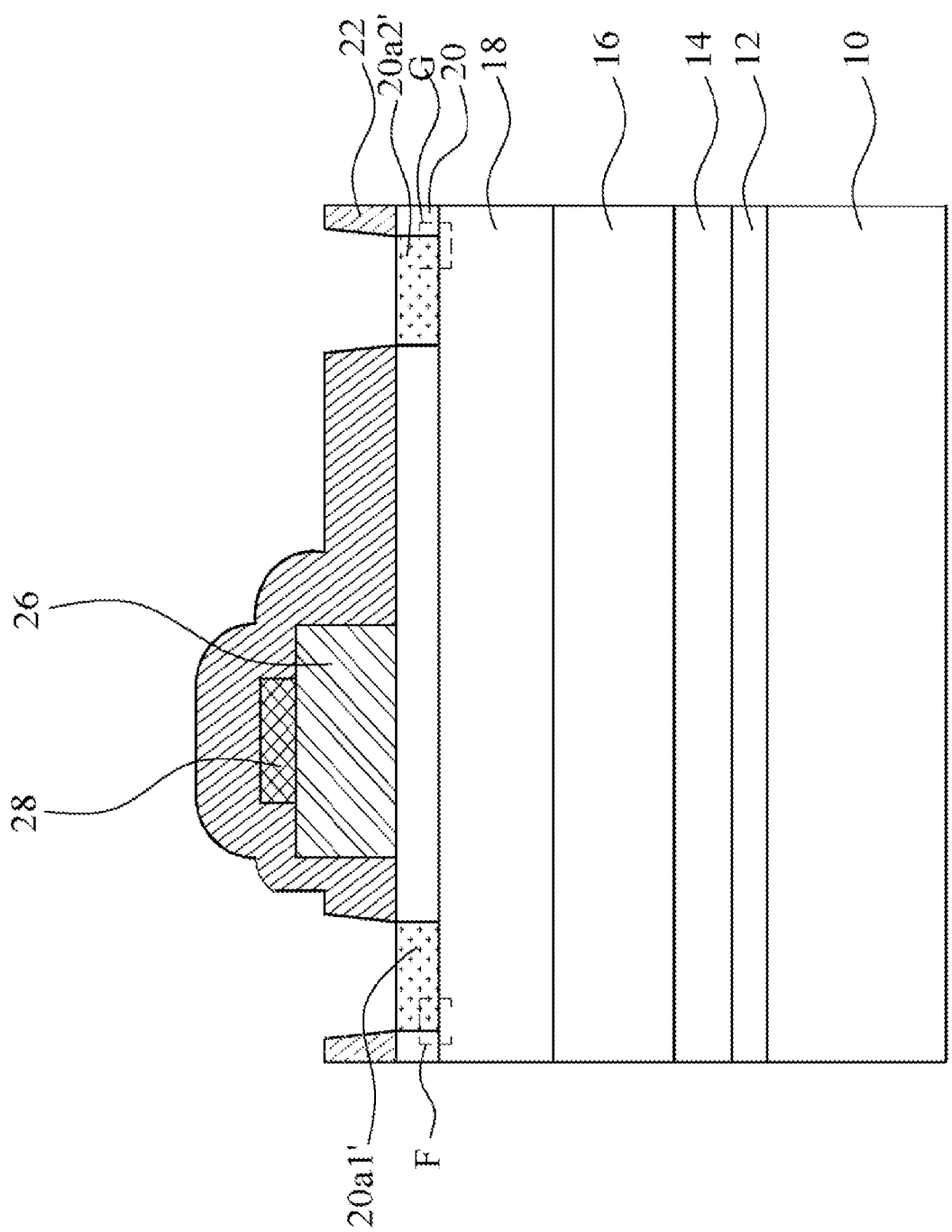

Referring to FIG. 5G, the openings 20h1 and 20h2 can be filled with materials different from the barrier layer 20. In some embodiments, the openings 20h1 and 20h2 can be filled with heterogeneous alloys, AlGaN with low aluminum content, or n-type GaN. In some embodiments, heterogeneous alloys, AlGaN with low aluminum content, or n-type GaN can be formed by, for example, chemical vapor deposition (CVD), physical vapor deposition (PVD), epitaxial growth, or other suitable deposition processes. The process performed in FIG. 5G can also be known as selective area growth (SAG).

Regions 20a1' and 20a2' can be formed after the openings 20h1 and 20h2 are filled. Since the regions 20a1' and 20a2' of FIG. 5G are formed by a process different from the regions 20a1 and 20a2 of FIG. 4F, the regions 20a1' and 20a2' may include microstructures that are different from those of the regions 20a1 and 20a2. An enlarged view of the dotted-rectangles F and G shown in FIG. 5G will be illustrated in FIGS. 6A and 6B in a subsequent paragraph.

After the process shown in FIG. 5G is performed, the crystal structure within the region 20a1' and the region 20a2' will not be identical to the barrier layer 20. The crystal orientation of the region 20a1' will not be the same as that of the channel layer 18. The crystal orientation of the region 20a2' will not be the same as that of the channel layer 18. The crystal orientation of the region 20a2' will not be the same as that of the barrier layer 20. Different crystal orientations across the regions 20a1', 20a2', the barrier layer 20 and the channel layer 18 can adversely affect the yield rate of the HEMT produced. Different crystal orientations across the regions 20a1', 20a2', the barrier layer 20 and the channel layer 18 can adversely affect the reliability of the HEMT produced.

Figure 5H:
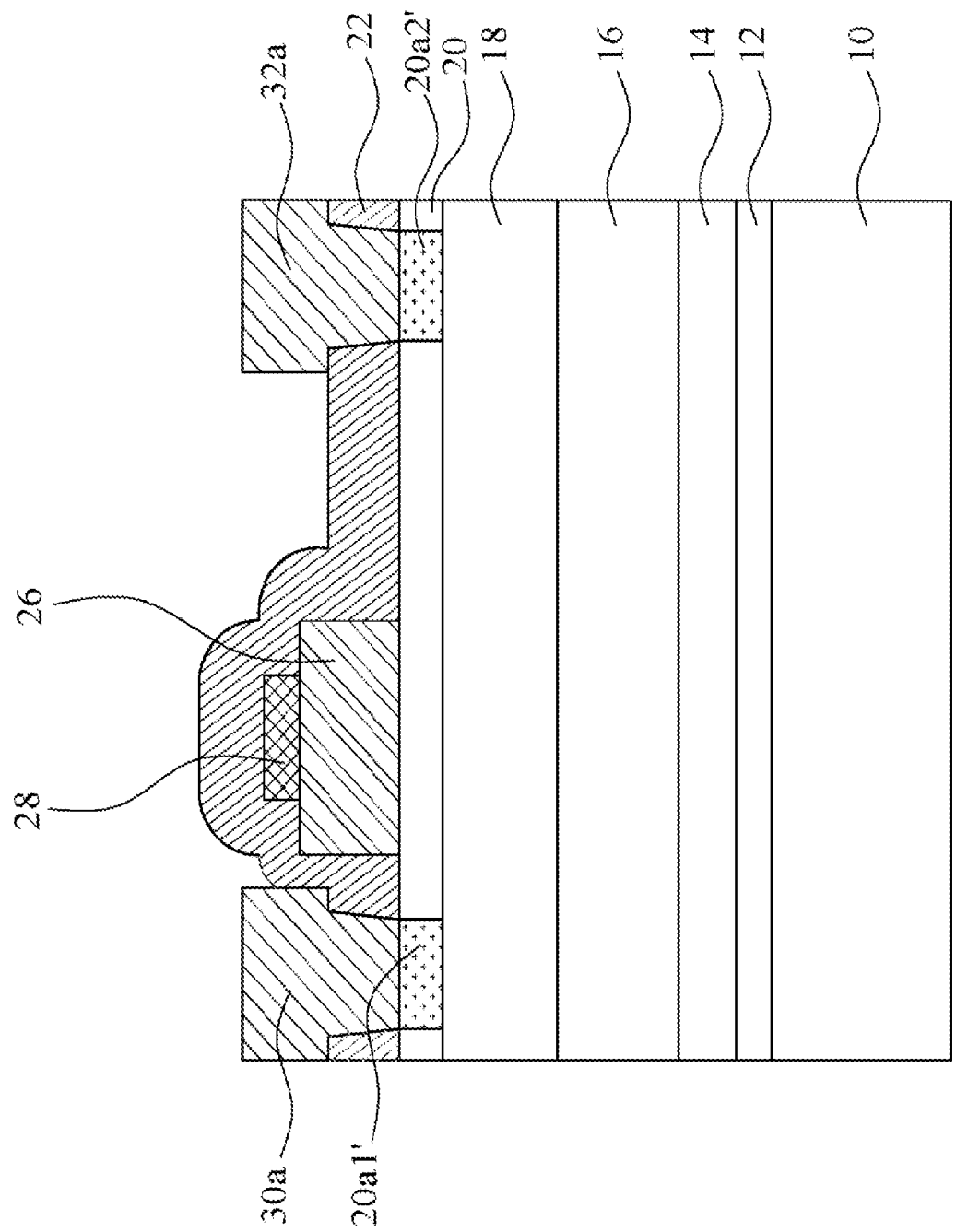

Referring to FIG. 5H, conductors 30a and 32a can be formed. The conductor 30a can be formed in contact with the region 20a1'. The conductor 32a can be formed in contact with the region 20a2'. A portion of the conductor 30a can be surrounded by the passivation layer 22. A portion of the conductor 32a can be surrounded by the passivation layer 22.

In some embodiments, the conductors 30a and 32a can be formed using techniques, for example, but not limited to soldering, welding, crimping, deposition, or electroplating. In some embodiments, the conductors 30a and 32a may include, for example, but are not limited to, titanium (Ti), aluminum (Al), Nickel (Ni), Gold (Au), Palladium (Pd), or any combinations or alloys thereof.

Figure 5I:
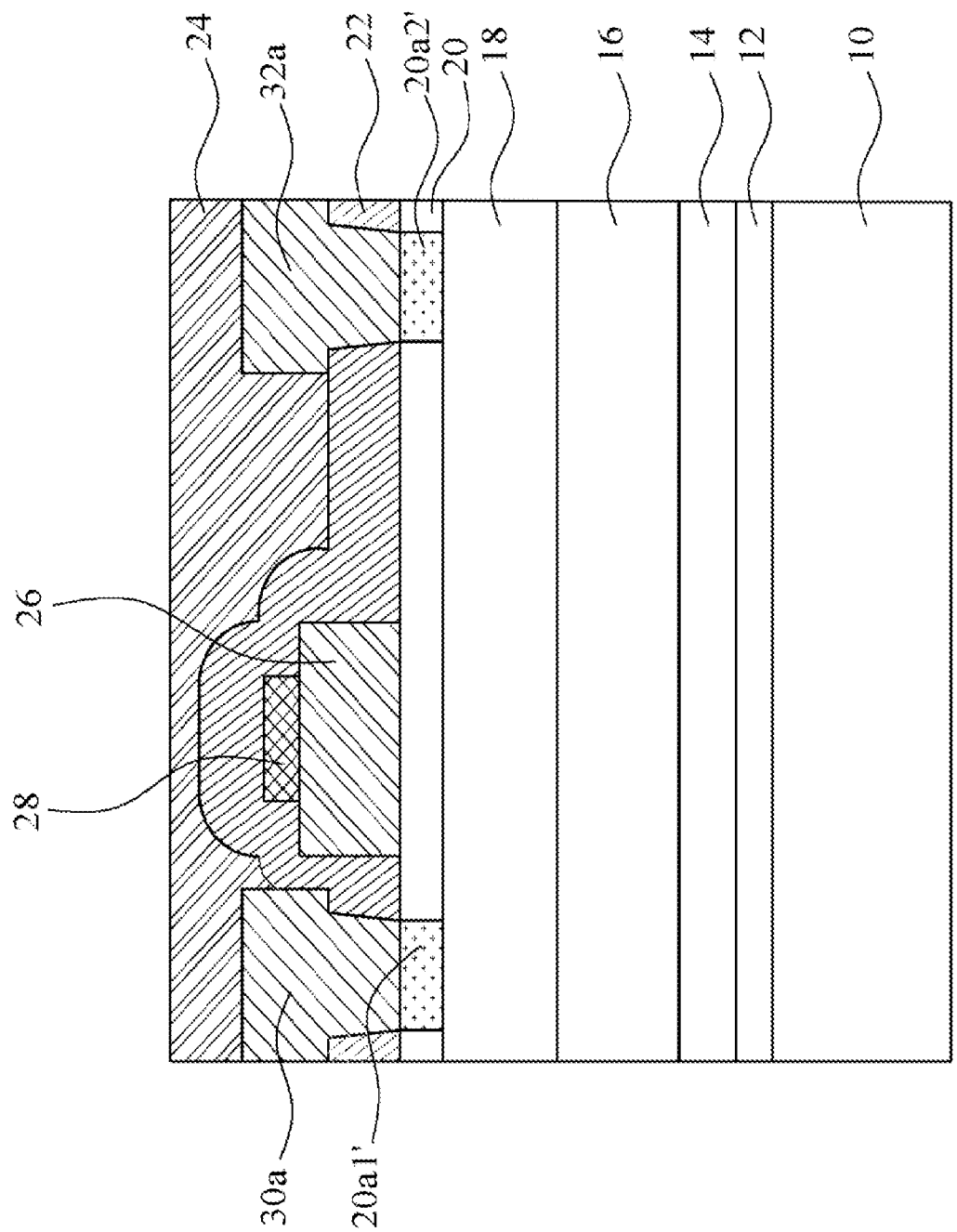

Referring to FIG. 5I, a passivation layer 24 is formed. The passivation layer 24 is disposed above and covers the conductors 30a and 32a and the passivation layer 22. The operation shown in FIG. 5I is similar to that shown in FIG. 4H, and thus the details will not be repeated here.

Figure 5J:
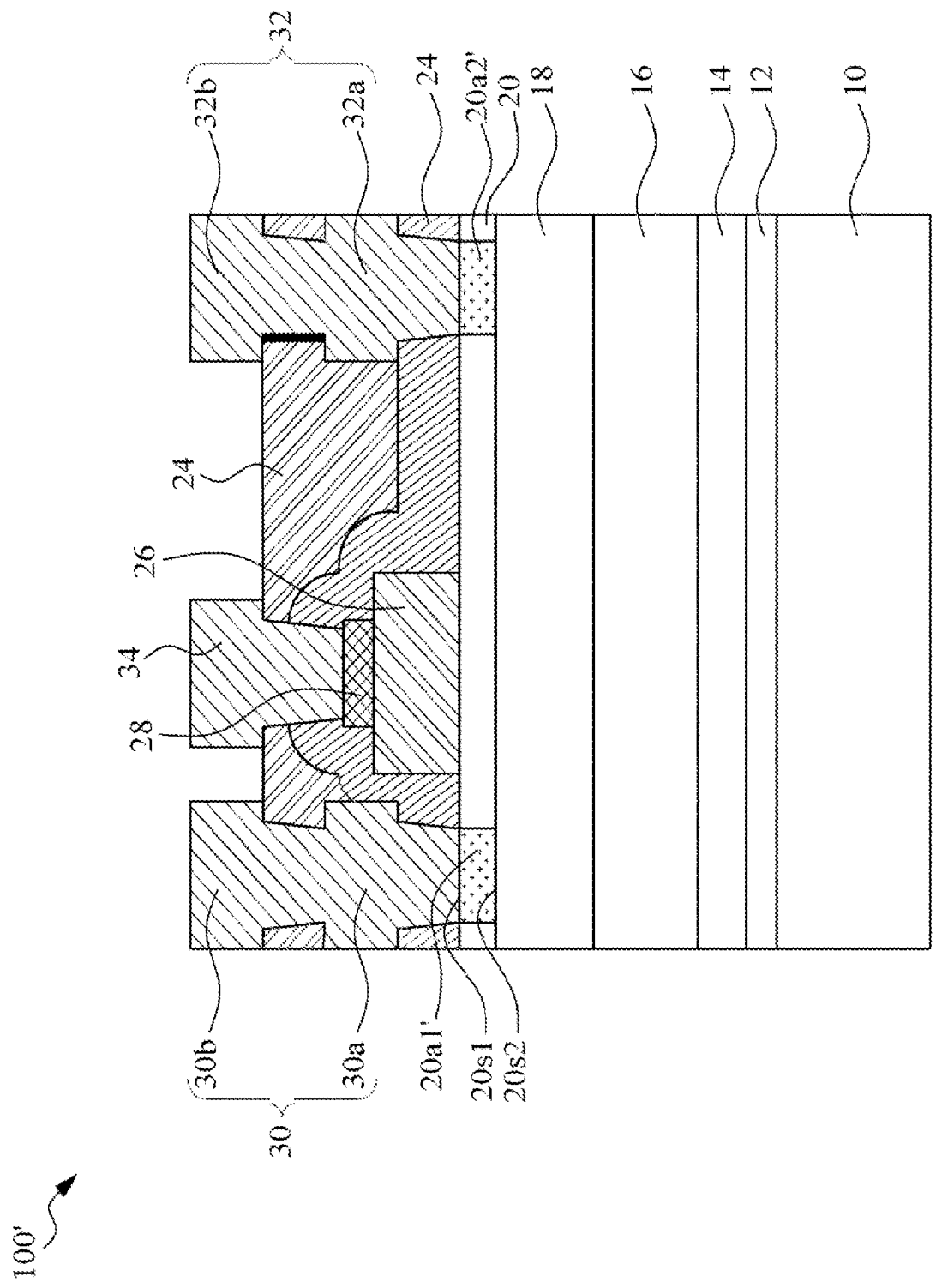

Referring to FIG. 5J, conductors 30b and 32b and electrode 34 can be formed. The conductor 30b is formed above and in contact with the conductor 30a. The conductors 30a and 30b form the electrode 30. The conductor 32b is formed above and in contact with the conductor 32a. The conductors 32a and 32b form the electrode 32. The electrodes 30, 32 and 34 are exposed by the passivation layer 24. The electrodes 30, 32 and 34 are not not covered by the passivation layer 24.

A HEMT 100' can be obtained after the operations described in accordance with FIGS. 5A, 5B, 5C, 5D, 5E, 5F, 5G, 5H, 5I and 5J are performed.

Figure 6A:
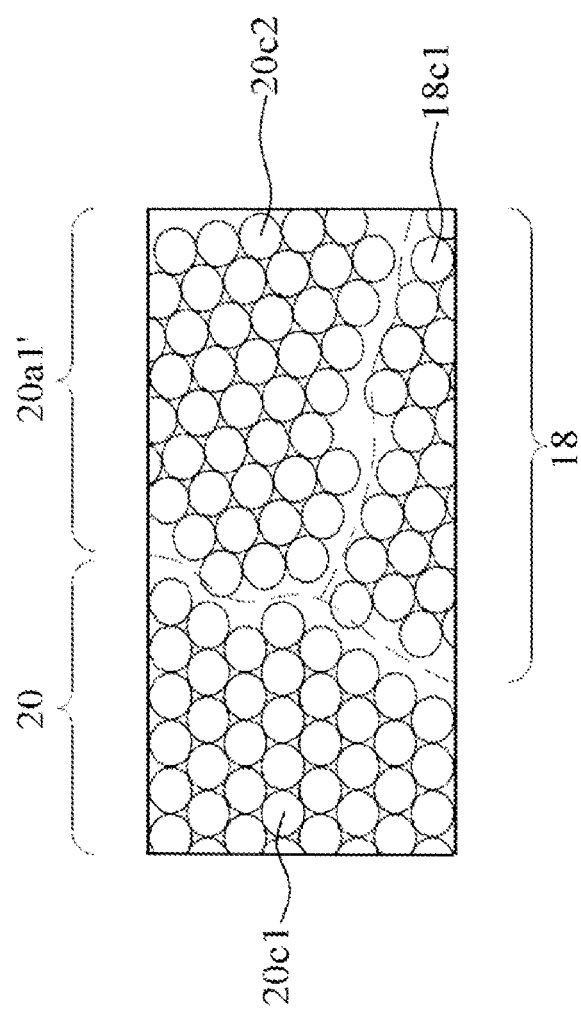
FIG. 6A illustrates a schematic view of the polycrystalline structure in the dotted-rectangle F as shown in FIG. 5G.

FIG. 6A illustrates a schematic view of a portion of a semiconductor device according to some embodiments of the present disclosure. FIG. 6A shows an enlarged view of the dotted-rectangle F of FIG. 5G.

FIG. 6A shows the crystals near the interfaces between the region 20a1', the channel layer 18, and the barrier layer 20 of the HEMT 100'. The barrier layer 20 includes a plurality of crystals 20c1. The channel layer 18 includes a plurality of crystals 18c1. The region 20a1' includes a plurality of crystals 20c2. In some embodiments, the crystals 20c1 of the barrier layer 20 form an individual crystallite. In some embodiments, the crystals 20c2 of the region 20a1' form an individual crystallite. In some embodiments, the crystals 18c1 of the channel layer 18 form an individual crystallite.

The structure shown in FIG. 6A corresponds to a polycrystalline structure, which includes individual crystallites composed of crystals 20c1, 20c2 and 18c1. In some embodiments, the crystals 20c2 do not take over the crystal structure of the crystals 18c1. In some embodiments, the crystals 20c2 do not take over the crystal structure of the crystals 20c1. In some embodiments, the crystals 20c1 do not take over the crystal structure of the crystals 18c1.

Figure 6B:
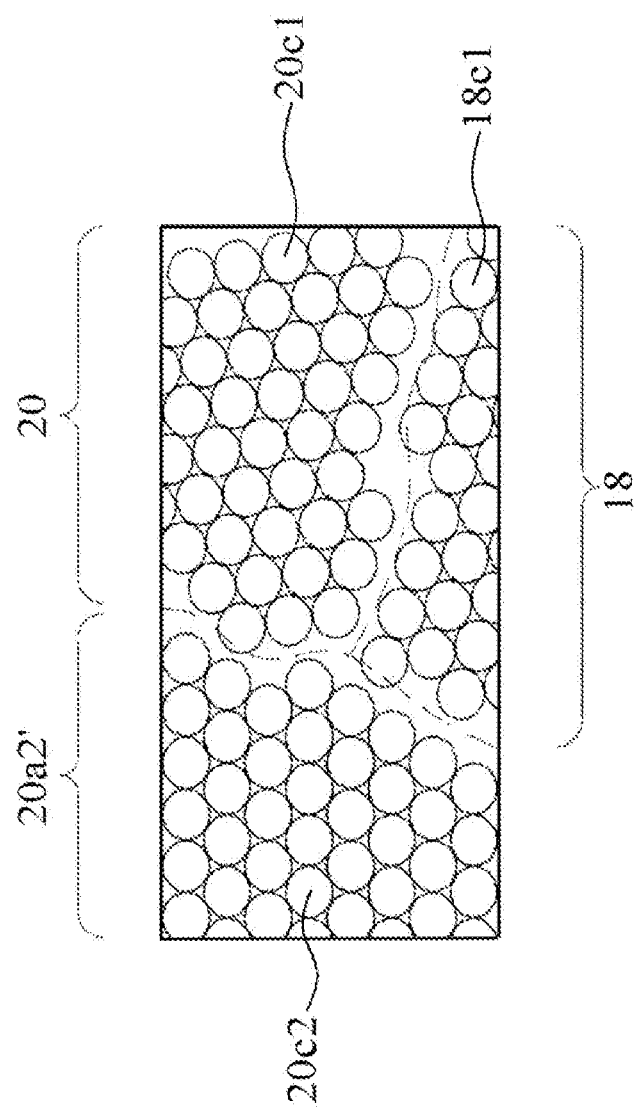
FIG. 6B illustrates a schematic view of the polycrystalline structure in the dotted-rectangle G as shown in FIG. 5G.

FIG. 6B illustrates a schematic view of a portion of a semiconductor device according to some embodiments of the present disclosure. FIG. 6B shows an enlarged view of the dotted-rectangle G of FIG. 5G.

FIG. 6B shows the crystals near the interfaces between the region 20a2', the channel layer 18, and the barrier layer 20 of the HEMT 100'. The barrier layer 20 includes a plurality of crystals 20c1. The channel layer 18 includes a plurality of crystals 18c1. The region 20a2' includes a plurality of crystals 20c2. In some embodiments, the crystals 20c1 of the barrier layer 20 form an individual crystallite. In some embodiments, the crystals 20c2 of the region 20a2' form an individual crystallite. In some embodiments, the crystals 18c1 of the channel layer 18 form an individual crystallite.

The structure shown in FIG. 6B corresponds to a polycrystalline structure, which includes individual crystallites composed of crystals 20c1, 20c2 and 18c1. In some embodiments, the crystals 20c2 do not take over the crystal structure of the crystals 18c1. In some embodiments, the crystals 20c2 do not take over the crystal structure of the crystals 20c1. In some embodiments, the crystals 20c1 do not take over the crystal structure of the crystals 18c1.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device, comprising:
a substrate;
a first nitride semiconductor layer on the substrate;
a second nitride semiconductor layer on the first nitride semiconductor layer and having a bandgap greater than a bandgap of the first nitride semiconductor layer, the second nitride semiconductor layer having a first area and a second area, and the second nitride semiconductor layer having a single crystal structure; and
an electrode in contact with the first area,
wherein a first concentration of an element in the first area is less than a second concentration of the element in the second area, the second area comprises the element gradientially distributed along a direction toward the first nitride semiconductor layer, and wherein the single crystal structure in the first area takes over a crystal structure in the first nitride semiconductor layer.

2. The semiconductor device according to claim 1, wherein the first area of the second nitride semiconductor layer is devoid of polycrystalline structures.

3. The semiconductor device according to claim 1, wherein a first interface between the first area and the second area is devoid of polycrystalline structures.

4. The semiconductor device according to claim 1, wherein a second interface between the first area and the first nitride semiconductor layer is devoid of polycrystalline structures.

5. The semiconductor device according to claim 1, wherein an amount of the element in the first area is uneven.

6. The semiconductor device according to claim 1, wherein the first concentration of the element in the first area is gradient.

7. The semiconductor device according to claim 1, wherein a first amount of the element in the first area adjacent to the electrode is smaller than a second amount of the element in the first area adjacent to the first nitride semiconductor layer.

8. The semiconductor device according to claim 1, wherein the first area of the second nitride semiconductor layer includes a rough surface.

9. The semiconductor device according to claim 1, wherein the second area of the second nitride semiconductor layer includes a smooth surface.

10. The semiconductor device according to claim 1, wherein the first area of the second nitride semiconductor layer includes a pyramid-like structure from a cross sectional view perspective.

11. The semiconductor device according to claim 1, wherein the first area of the second nitride semiconductor layer includes a porous structure.

12. A semiconductor device, comprising:
a substrate;
a first nitride semiconductor layer disposed above the substrate;
a second nitride semiconductor layer on the first nitride semiconductor layer and having a first area and a second area; and
a first electrode in contact with the first area,
wherein the first area comprises an element gradientially distributed along a direction from the first electrode toward the first nitride semiconductor layer, and the second area comprises the element gradientially distributed along the direction from the first electrode toward the first nitride semiconductor layer, and the element of the first area gradually increases along the direction from the first electrode toward the first nitride semiconductor layer.

13. The semiconductor device according to claim 12, wherein the second area comprises an element gradually decreases along a direction toward the first nitride semiconductor layer.

14. The semiconductor device according to claim 12, wherein the element is electrically conductive.

15. The semiconductor device according to claim 12, wherein the element is Aluminum (Al).

16. The semiconductor device according to claim 12, wherein the first area is devoid of polycrystalline structures.

17. The semiconductor device according to claim 12, wherein the first area includes single crystals, and the single crystals in the first area take over a crystal structure of the first nitride semiconductor layer.

18. The semiconductor device according to claim 12, wherein a first concentration of the element of the first area is less than 30%.

19. A method for fabricating a semiconductor device, comprising:
   providing a semiconductor structure having a substrate, a channel layer and a barrier layer;
   providing a passivation layer on the barrier layer, the passivation layer exposes a first area of the barrier layer and covers a second area of the barrier layer; and
   wet-soaking the first area of the barrier layer with a first solution so that a first concentration of an element of the wet-soaked first area is different from a second concentration of the element of the second area, wherein the second area comprises the element gradientially distributed along a direction toward the channel layer.

20. The method according to claim 19, further comprising forming an electrode contact in contact with the wet-soaked first area.

21. The method according to claim 19, wherein the first solution comprises one of: Sodium hydroxide, Potassium hydroxide and AZ4000K photoresist developer.

22. The method according to claim 19, wherein the first concentration of the element of the wet-soaked first area is less than 30%.

23. The method according to claim 19, wherein the element is electrically conductive.

* * * * *